(12) United States Patent
Yamazaki

(10) Patent No.: US 8,541,266 B2
(45) Date of Patent: Sep. 24, 2013

(54) METHOD FOR MANUFACTURING SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/429,977

(22) Filed: Mar. 26, 2012

(65) Prior Publication Data
US 2012/0252160 A1    Oct. 4, 2012

(30) Foreign Application Priority Data
Apr. 1, 2011    (JP) ................................. 2011-081859

(51) Int. Cl.
*H01L 21/00*    (2006.01)
*H01L 21/84*    (2006.01)

(52) U.S. Cl.
USPC ............. 438/149; 438/104; 438/158; 257/43; 257/E51.006; 257/E21.414

(58) Field of Classification Search
USPC .................. 438/104; 257/E51.005, E51.006; 118/719
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,270,619 B1 * | 8/2001 | Suzuki et al. ............ 156/345.22 |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility Zno Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Michelle Mandala
*Assistant Examiner* — Shaka White
(74) *Attorney, Agent, or Firm* — Eric J. Robinson; Robinson Intellectual Property Law Office, P.C.

(57) ABSTRACT

In a method for manufacturing a transistor including an oxide semiconductor layer, a gate electrode is formed and then an aluminum oxide film, a silicon oxide film, and the oxide semiconductor film are successively formed in an in-line apparatus without being exposed to the air and are subjected to heating and oxygen adding treatment in the in-line apparatus. Then, the transistor is covered with another aluminum oxide film and is subjected to heat treatment, so that the oxide semiconductor film from which impurities including hydrogen atoms are removed and including a region containing oxygen at an amount exceeding that in the stoichiometric composition ratio. The transistor including the oxide semiconductor film is a transistor having high reliability in which the amount of change in threshold voltage of the transistor by the bias-temperature stress (BT test) can be reduced.

20 Claims, 17 Drawing Sheets

(56) References Cited

U.S. PATENT DOCUMENTS

| | | |
|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,642,573 B2 | 1/2010 | Hoffman et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,838,348 B2 | 11/2010 | Hoffman et al. |
| 7,910,490 B2 | 3/2011 | Akimoto et al. |
| 7,932,521 B2 | 4/2011 | Akimoto et al. |
| 8,093,136 B2 | 1/2012 | Endo et al. |
| 8,129,717 B2 | 3/2012 | Yamazaki et al. |
| 2001/0046027 A1 | 11/2001 | Tai et al. |
| 2001/0049163 A1* | 12/2001 | Yamazaki et al. ............ 438/158 |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0261709 A1 | 12/2004 | Sakata |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0321731 A1 | 12/2009 | Jeong et al. |
| 2010/0025675 A1 | 2/2010 | Yamazaki et al. |
| 2010/0025676 A1 | 2/2010 | Yamazaki et al. |
| 2010/0025677 A1 | 2/2010 | Yamazaki et al. |
| 2010/0025679 A1 | 2/2010 | Yamazaki et al. |
| 2010/0035379 A1 | 2/2010 | Miyairi et al. |
| 2010/0051938 A1 | 3/2010 | Hayashi et al. |
| 2010/0065844 A1 | 3/2010 | Tokunaga |
| 2010/0090217 A1 | 4/2010 | Akimoto |
| 2010/0092800 A1 | 4/2010 | Itagaki et al. |
| 2010/0109002 A1 | 5/2010 | Itagaki et al. |
| 2010/0117075 A1 | 5/2010 | Akimoto et al. |
| 2010/0136743 A1 | 6/2010 | Akimoto et al. |
| 2010/0295041 A1 | 11/2010 | Kumomi et al. |
| 2011/0104851 A1 | 5/2011 | Akimoto et al. |
| 2011/0115763 A1 | 5/2011 | Yamazaki et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2011/0212569 A1 | 9/2011 | Yamazaki et al. |
| 2012/0001170 A1 | 1/2012 | Yamazaki |
| 2012/0252160 A1 | 10/2012 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", NATURE, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In-Ga-O TFTS,", SID Digest '08: SID International Symposium Digest of Technical Papers. May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350°C,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=in,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous Gizo ($Ga_2O_3$—$In_2O_3$—ZnO) TFT,", SID Digest '08: SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem Oleds,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02: Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for RFID Systems,", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D at al., "Optical Studies of the Amorphous Liquid-Cholesteric Liquid Crystal Transition: The "Blue Phase", ", Physics Letters, Sep. 10, 1973, vol. 45A, No. 2, pp. 115-116.

Cho.D et al., "21.2:AL and SN-Doped Zinc Indium Oxide Thin Film Transistors for Amoled Back Plane,", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09: SID International Symposium Digest of Technical Papers, May 31, 2009, pp. 191-193.

Jin.D et al., "65.2:Distinguished Paper:World-Largest (6.5") Flexible Full Color Top Emission Amoled Display on Plastic Film and Its Bending Properties,", SID Digest '09 : SID Eng. International Symposium Digest of Technical Papers, May 31, 2009, pp. 983-985.

Sakata.J et al., "Development of 4.0-In. Amoled Display With Driver Circuit Using Amorphous In—Ga—Zn-Oxide TFTs,", IDW '09: Proceedings of the 16th International Display Workshops, 2009, pp. 689-692.

Park.J et al., "Amorphous Indium-Gallium-Zinc Oxide TFTs and Their Application for Large Size Amoled,", AM-FPD '08 Digest of Technical Papers, Jul. 2, 2008, pp. 275-278.

Parks.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure For Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09: SID International Symposium Digest of Technical Papers, May 31, 2009, pp. 1110-1112.

Ohara.H et al., "21.3:4.0 In. QVGA Amoled Display Using In—Ga—Zn-Oxide TFTs With a Novel Passivation Layer,", SID Digest '09: SID International Symposium Digest of Technical Papers, May 31, 2009, pp. 284-287.

Miyasaka.M, "Suftla Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09: SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09: SID International Symposium of Technical Papers, May 31, 2009, pp. 395-398.

Lee.H at al., "Current Status of, Challenges to, and Perspective View of AM-OLED ,", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel, YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu, or Zn] at temperatures over 1000 °C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Melboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size Amoled Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clarks et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 with Sputtered Al2O3 Gate Insulator,", Appl. Phys. Lett. (Applied Physics Letters), Sep. 1, 2003, vol. 83, No. 9, pp. 1755-1757.

\* cited by examiner

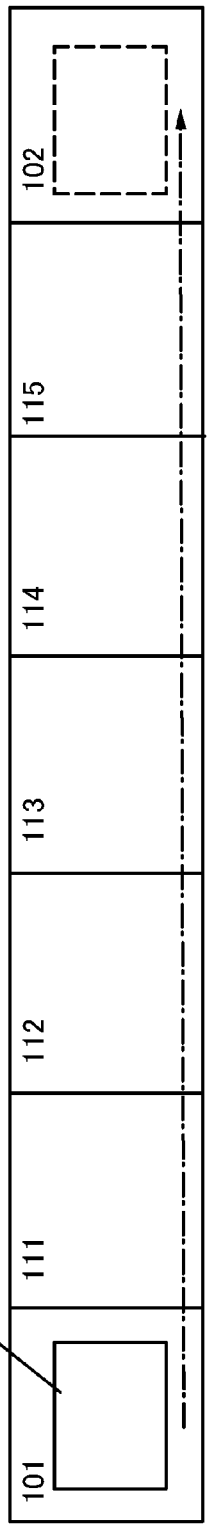
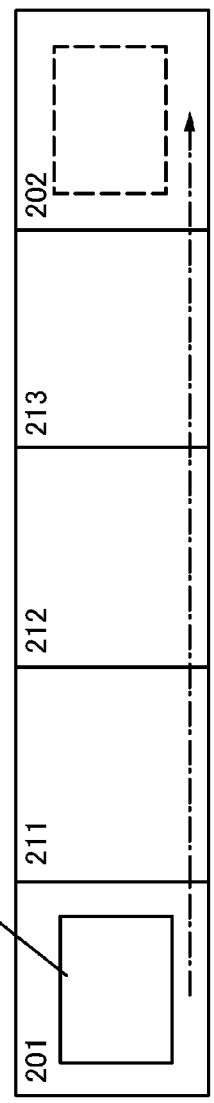
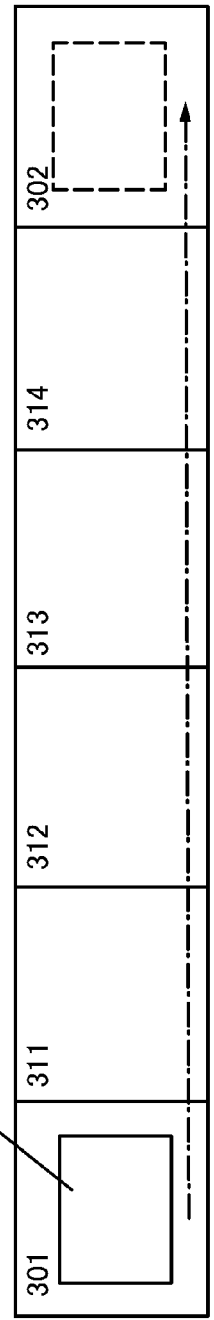
FIG. 4A
FIG. 4B
FIG. 4C

FIG. 14A1
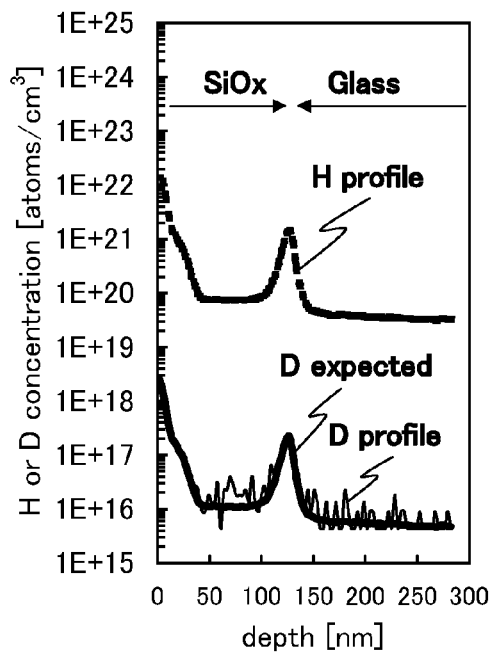
FIG. 14A2
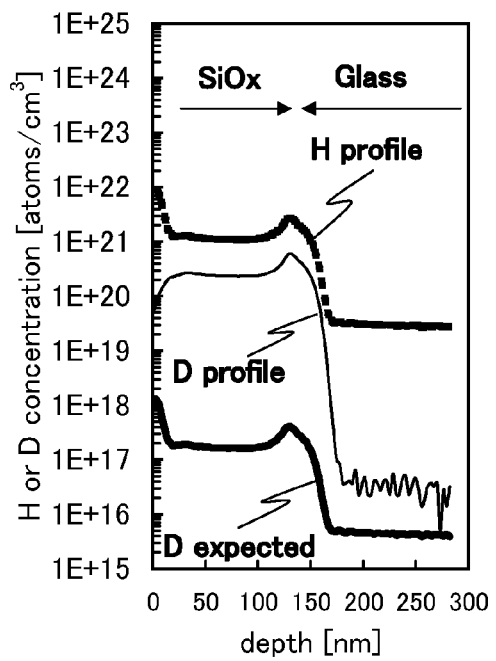
FIG. 14B1
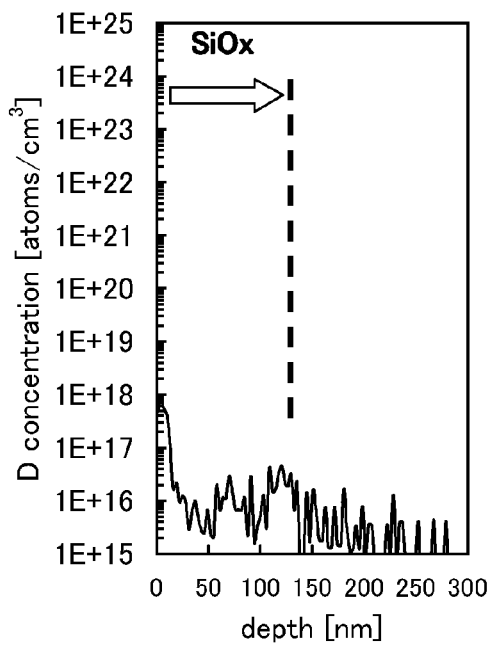
FIG. 14B2
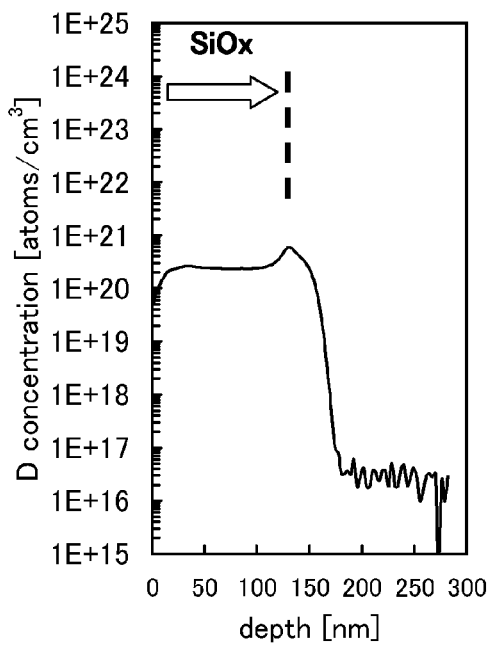

FIG. 15A1
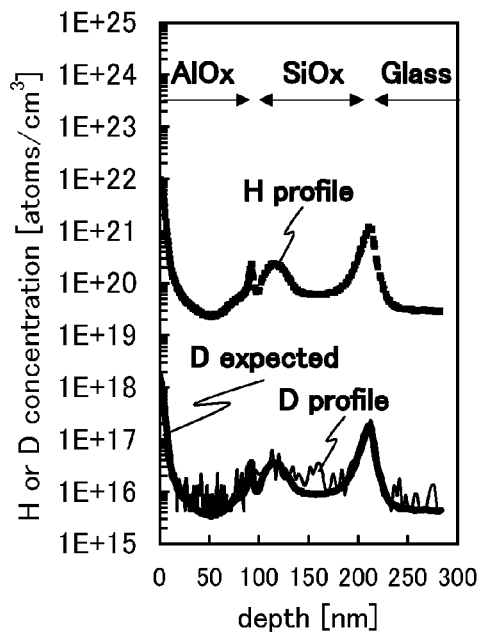
FIG. 15A2
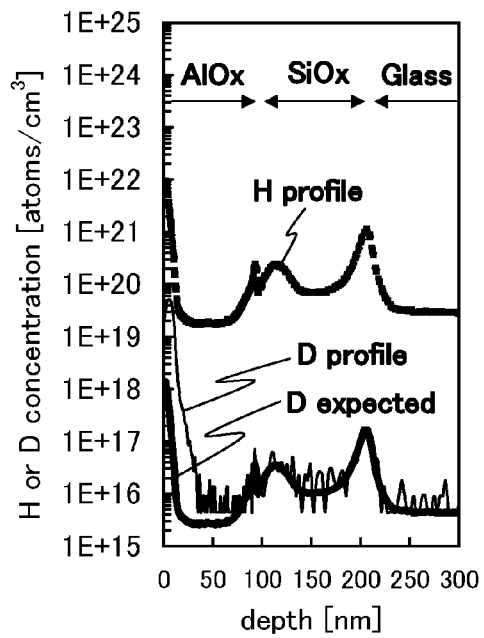
FIG. 15B1
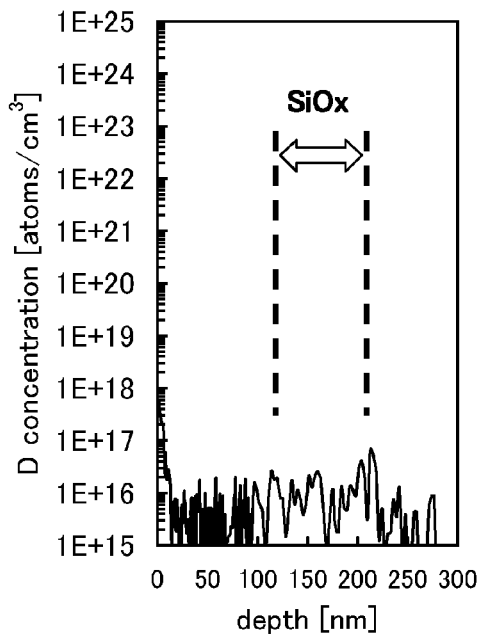
FIG. 15B2
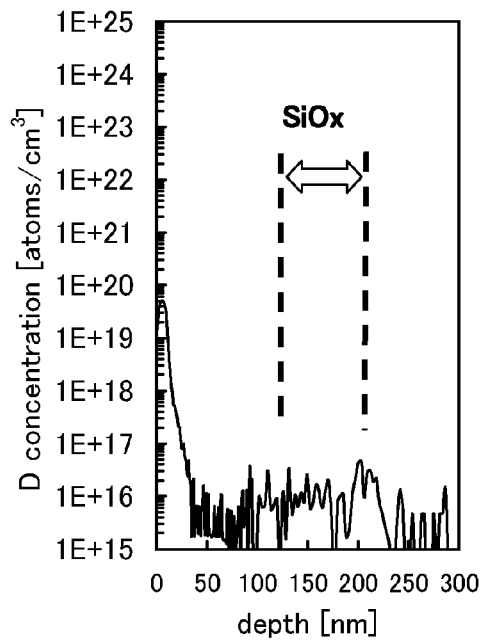

METHOD FOR MANUFACTURING SEMICONDUCTOR DEVICE

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and electronic equipment are all semiconductor devices.

2. Description of the Related Art

A technique by which transistors are formed using semiconductor thin films over a substrate having an insulating surface has been attracting attention. Such transistors are applied to a wide range of electronic devices such as an integrated circuit (IC) and an image display device (display device). A silicon-based semiconductor material is widely known as a material for a semiconductor thin film applicable to a transistor. As another material, an oxide semiconductor has been attracting attention.

For example, a transistor whose active layer is formed using an amorphous oxide containing indium (In), gallium (Ga), and zinc (Zn) and having an electron carrier concentration lower than $10^{18}/cm^3$ is disclosed (see Patent Document 1).

[Reference]
[Patent Document]
[Patent Document 1] Japanese Published Patent Application No. 2006-165528

SUMMARY OF THE INVENTION

However, in a semiconductor device including an oxide semiconductor, an oxygen vacancy, moisture, hydrogen, or the like in the oxide semiconductor might change the electric conductivity thereof. Such a phenomenon becomes a factor of fluctuation in the electric characteristics of a transistor formed using the oxide semiconductor.

In view of the above problem, an object of one embodiment of the present invention is to provide a semiconductor device formed using an oxide semiconductor, which has stable electric characteristics and high reliability. Another object of one embodiment of the present invention is to establish and provide Yoctronics (yocto ampere electronics: electronics dealing in current of yocto ampere (yA)) as a new field of electronics, utilizing a characteristic in that off-state current of a semiconductor device formed using an oxide semiconductor is extremely small (at the yocto-ampere level).

In a manufacturing process of a transistor including an oxide semiconductor layer, the oxide semiconductor layer is sandwiched between aluminum oxide films to suppress oxygen detachment from the oxide semiconductor layer. Further, it is possible to remove impurities containing hydrogen atoms (e.g., hydrogen, moisture, and the like) by performing heat treatment on the oxide semiconductor film. Further, by successively forming stacked films of the transistor in an in-line apparatus which is a fast cycle apparatus, impurity concentration at an interface between each layer can be extremely reduced. Accordingly, a transistor whose characteristics are further stabilized can be obtained. More specifically, for example, the following manufacturing method can be employed.

One embodiment of the present invention is a method for manufacturing a semiconductor device including the steps of: forming a gate electrode; forming a gate insulating film including a first aluminum oxide film ($AlO_{x1}$, x1>3/2) and a silicon oxide film ($SiO_y$, y>2) over the first aluminum oxide film; forming an oxide semiconductor film over the gate insulating film overlapping with the gate electrode; forming a source electrode layer and a drain electrode layer which are electrically connected to the oxide semiconductor film; and forming a second aluminum oxide film ($AlO_{x2}$, x2>3/2) over the oxide semiconductor film. The gate insulating film and the oxide semiconductor film are successively formed in a first in-line apparatus without exposure to the air and then are subjected to first heat treatment and oxygen supplying treatment in the first in-line apparatus.

Another embodiment of the present invention is a method for manufacturing a semiconductor device including the steps of: forming a gate electrode; forming a gate insulating film over the gate electrode and including a first aluminum oxide film ($AlO_{x1}$, x1>3/2) and a first silicon oxide film ($SiO_{y1}$, y1>2) over the first aluminum oxide film; forming an oxide semiconductor film over the gate insulating film overlapping with the gate electrode; forming a source electrode layer and a drain electrode layer which are electrically connected to the oxide semiconductor film; and forming a protective layer including a second silicon oxide film ($SiO_{y2}$, y2>2) and a second aluminum oxide film ($AlO_{x2}$, x2>3/2) over the second silicon oxide film. The gate insulating film and the oxide semiconductor film are successively formed in a first in-line apparatus without exposure to the air and then are subjected to first heat treatment and oxygen supplying treatment in the first in-line apparatus. The protective layer is formed successively in a second in-line apparatus and is subjected to second heat treatment in the second in-line apparatus.

Another embodiment of the present invention is a method for manufacturing a semiconductor device including the steps of: forming a gate electrode; forming a gate insulating film over the gate electrode, comprising a first aluminum oxide film ($AlO_{x1}$, x1>3/2) and a first silicon oxide film ($SiO_{y1}$, y1>2) over the first aluminum oxide film; forming an oxide semiconductor film over the gate insulating film overlapping with the gate electrode; forming a source electrode layer and a drain electrode layer which are electrically connected to the oxide semiconductor film; and forming a protective layer over the oxide semiconductor film and including a second silicon oxide film ($SiO_{y2}$, y2>2), a thin film X which includes a mixed film of an organic substance and a metal oxide, a transparent conductive oxide film, or an oxide semiconductor film containing nitrogen over the second silicon oxide film, and a second aluminum oxide film ($AlO_{x2}$, x2>3/2) over the thin film X. The gate insulating film and the oxide semiconductor film are successively formed in a first in-line apparatus without exposure to the air and then are subjected to first heat treatment and oxygen supplying treatment in the first in-line apparatus. The protective layer is formed successively in a second in-line apparatus and is subjected to a second heat treatment in the second in-line apparatus.

The second heat treatment is preferably performed at a temperature higher than or equal to 275° C. and lower than or equal to 325° C. because oxygen is hardly removed.

In addition, in the oxygen supplying treatment in the method for manufacturing a semiconductor device, a peak of the concentration of oxygen added to the oxide semiconductor film is preferably higher than or equal to $1 \times 10^{18}/cm^3$ and lower than or equal to $3 \times 10^{21}/cm^3$ in the depth direction.

In a manufacturing process of a transistor including an oxide semiconductor layer, oxygen supplying treatment (oxygen adding treatment) is performed on the oxide semiconductor layer, and then heat treatment is performed in a state where an aluminum oxide film which has a function of preventing the entry of water (including hydrogen) into an oxide semiconductor and a function of preventing oxygen detachment from an oxide semiconductor is provided over the oxide semiconductor layer. Consequently, a region where oxygen exists at an amount exceeding that in the stoichiometric composition (also referred to as oxygen-excess region) can be provided at least in the inside of the oxide semiconductor layer (bulk) or an interface between a gate insulating film and the oxide semiconductor layer. Note that oxygen which is added by the oxygen supplying treatment may exist between lattices of the oxide semiconductor.

It is preferable that dehydration or dehydrogenation by heat treatment be performed on the oxide semiconductor and a hydrogen atom or an impurity containing a hydrogen atom such as water in the oxide semiconductor be removed, so that the oxide semiconductor layer is highly purified.

The effect of the above structure which is one embodiment of the disclosed invention can be easily understood as follows. Note that the below description is just one consideration.

In general, oxygen contained in an oxide semiconductor dynamically repeats reactions of bonding to and detachment from a metal element in the oxide semiconductor as shown by the following formula (1). A metal element from which oxygen is removed has a dangling bond, whereby an oxygen vacancy exists in a position of the oxide semiconductor, where the oxygen is removed.

[FORMULA 1]

$$M\text{-}O \rightleftharpoons M+O \quad (1)$$

An oxide semiconductor layer according to one embodiment of the disclosed invention contains excess oxygen in the adjacent film (preferably at an amount exceeding that in the stoichiometric composition), and thus an oxygen vacancy in the oxide semiconductor layer can be immediately compensated. Therefore, the density of states (DOS) attributed to an oxygen vacancy in the oxide semiconductor layer can be reduced. For example, when the oxide semiconductor layer contains oxygen at an amount which agrees with that in the stoichiometric composition ratio of the oxide semiconductor and the average DOS is approximately higher than or equal to $10^{18}$ cm$^{-3}$ and lower than or equal to $10^{19}$ cm$^{-3}$, the average DOS of the oxide semiconductor containing oxygen at an amount exceeding that in the stoichiometric composition ratio of the oxide semiconductor can be approximately higher than or equal to $10^{15}$ cm$^{-3}$ and lower than or equal to $10^{16}$ cm$^{-3}$.

In addition, it has been confirmed that as the thickness of an oxide semiconductor layer is increased, fluctuation in the threshold voltage of a transistor tends to increase. It can be guessed that this is because an oxygen defect in the oxide semiconductor layer is one cause of the change of the threshold voltage and increases in number as the thickness of the oxide semiconductor layer is increased. As described above, in the transistor according to one embodiment of the disclosed invention, since each of the amount of oxygen contained in the oxide semiconductor layer and the peripheral film is increased by the oxygen adding treatment to the oxide semiconductor layer and the adjacent film, an oxygen defect in the oxide semiconductor layer which is caused by the dynamic reaction according to the above formula (1) can be immediately compensated. Accordingly, the transistor according to one embodiment of the disclosed invention can have less fluctuation in threshold voltage, because time for formation of a donor level due to an oxygen defect can be shortened and the number of donor levels can be substantially zero.

Excess oxygen is contained in an oxide semiconductor layer and the adjacent film, and aluminum oxide films are provided over and under the oxide semiconductor layer so as to prevent the oxygen from being released, whereby it is possible to prevent occurrence and increase of a defect in the oxide semiconductor and interfaces between the oxide semiconductor and layers which are over and under the oxide semiconductor. In other words, excess oxygen contained in the oxide semiconductor layer and the adjacent film acts to compensate an oxygen vacancy defect and the oxide semiconductor layer is sandwiched between aluminum oxide films with a high bather property against oxygen, hydrogen, moisture, and the like, so that a highly reliable semiconductor device having stable electric characteristics can be provided. In addition, a silicon oxide film, an aluminum oxide film, an oxide semiconductor film, and the like can be formed successively without exposure to the air in an in-line apparatus, so that concentration of impurities (moisture, hydrogen, and the like) at interfaces of the films can be extremely reduced. Accordingly, a highly reliable semiconductor device having stable electric characteristics can be provided.

BRIEF DESCRIPTION OF THE DRAWINGS

In the accompanying drawings:

FIGS. 4A to 4C are each a block diagram of a deposition apparatus for a semiconductor device, according to one embodiment of the present invention;

FIGS. 14A1, 14A2, 14B1, and 14B2 show results of SIMS measurement;

FIGS. 15A1, 15A2, 15B1, and 15B2 show results of SIMS measurement;

DETAILED DESCRIPTION OF THE INVENTION

Hereinafter, embodiments and an example of the invention disclosed in this specification will be described in detail with reference to the accompanying drawings. Note that the invention disclosed in this specification is not limited to the following description, and it is easily understood by those skilled in the art that modes and details can be variously changed. Therefore, the invention disclosed in this specification is not construed as being limited to the description of the following embodiments and example.

Note that the ordinal numbers such as "first" and "second" in this specification are used for convenience and do not denote the order of steps and the stacking order of layers. In addition, the ordinal numbers in this specification do not denote particular names which specify the invention.

(Embodiment 1)

In this embodiment, one embodiment of a semiconductor device and a method for manufacturing the semiconductor device will be described with reference to FIGS. 1A to 1C, FIGS. 2A to 2C, and FIGS. 3A to 3C. In this embodiment, a transistor including an oxide semiconductor layer is shown as an example of the semiconductor device.

Figure 1A:
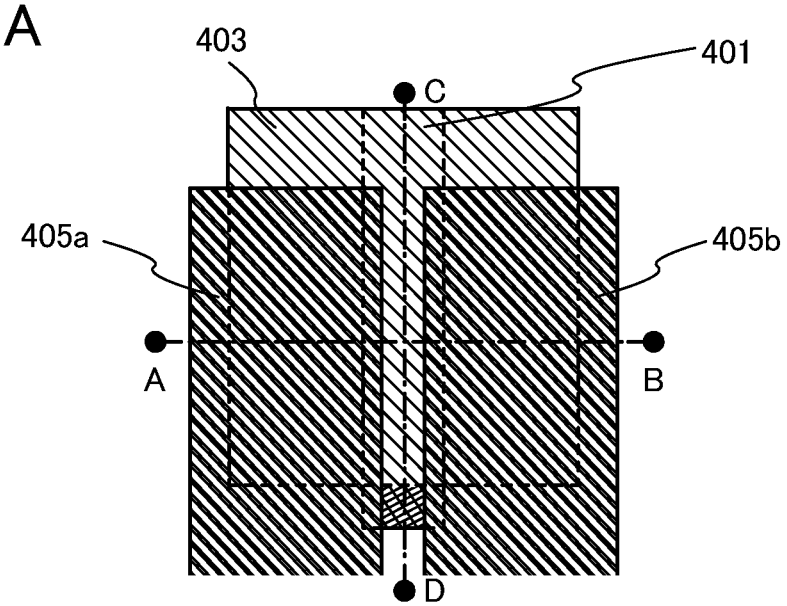
FIGS. 1A to 1C are a plan view and cross-sectional views which illustrate one embodiment of a semiconductor device.
Figure 1B:
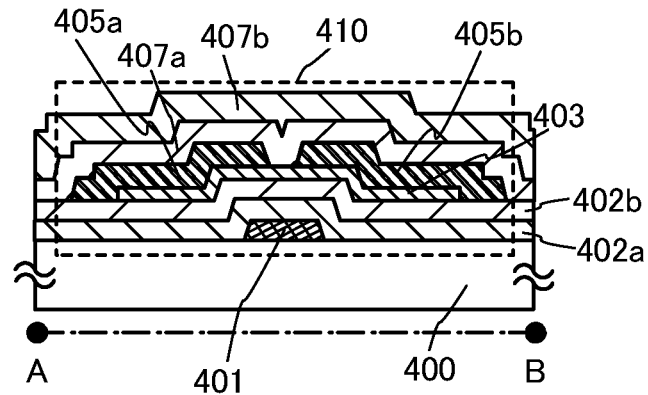
Figure 1C:
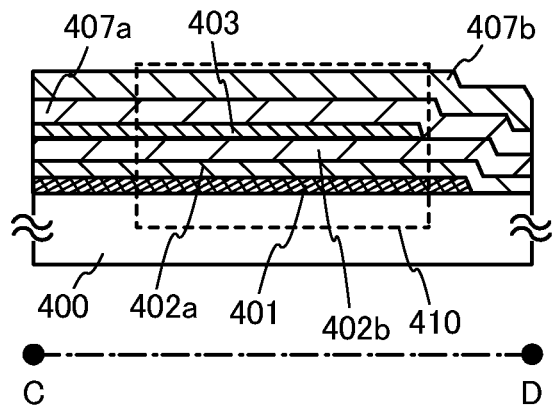

FIGS. 1A to 1C are a plan view and cross-sectional views of a bottom-gate transistor 410 as an example of a semiconductor device. FIG. 1A is a plan view and FIGS. 1B and 1C are cross-sectional views taken along line A-B and line C-D in FIG. 1A, respectively. Note that some components of the transistor 410 (e.g., a silicon oxide film 407a, an aluminum oxide film 407b, and the like) are not illustrated in FIG. 1A in order to avoid complexity.

The transistor 410 illustrated in FIGS. 1A to 1C includes, over a substrate 400 having an insulating surface, a gate electrode layer 401, an aluminum oxide film 402a and a silicon oxide film 402b which constitute a gate insulating film, an oxide semiconductor layer 403, a source electrode layer 405a, a drain electrode layer 405b, and the silicon oxide film 407a and the aluminum oxide film 407b which constitute an insulating film.

In the transistor 410 illustrated in FIGS. 1A to 1C, the gate insulating film is a stack of the aluminum oxide film 402a containing excessive oxygen ($AlO_x$, $x>3/2$) and the silicon oxide film 402b containing excessive oxygen ($SiO_x$, $x>2$). The oxide semiconductor layer 403 is subjected to oxygen adding treatment and thus includes an oxygen-excess region. By performing oxygen adding treatment, oxygen at an amount exceeding that in the stoichiometric composition ratio can be contained in the oxide semiconductor layer 403, so that the transistor 410 can have higher reliability. In addition, the aluminum oxide film 402a has an effect of suppressing oxygen detachment from the oxygen-excess region.

Further, the transistor 410 includes a stack of the silicon oxide film 407a containing excessive oxygen ($SiO_x$, $x>2$) and the aluminum oxide film 407b containing excessive oxygen ($AlO_x$, $x>3/2$). Since aluminum oxide has a barrier property and is less likely to transmit moisture, oxygen, and another impurity, the entry of an impurity such as moisture from the outside after completion of the device can be prevented. Moreover, release of oxygen from the oxide semiconductor layer 403 can be prevented. This advantageous effect becomes further significant when the oxide semiconductor layer 403 is sandwiched between the aluminum oxide film 402a and the aluminum oxide film 407b. Note that the silicon oxide film 407a is not necessarily provided.

It is preferable that the gate insulating film also includes an oxygen-excess region. When the gate insulating film includes an oxygen-excess region, oxygen can be prevented from moving from the oxide semiconductor layer 403 to the gate insulating film, and oxygen can be supplied from the silicon oxide film 402b to the oxide semiconductor layer 403.

Note that an insulating film may further be formed over the transistor 410. In addition, in order to electrically connect the source electrode layer 405a or the drain electrode layer 405b to a wiring, an opening may be formed in the silicon oxide film 407a, the aluminum oxide film 407b, and the like. Further, a second gate electrode may be provided above the oxide semiconductor layer 403.

FIGS. 2A to 2D illustrate an example of a method for manufacturing the transistor 410.

First, a conductive film is formed over the substrate 400 having an insulating surface and is subjected to a photolithography step, so that the gate electrode layer 401 is formed. Note that a resist mask may be formed by an inkjet method. No photomask is used when a resist mask is formed by an inkjet method; therefore, production cost can be reduced.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single-crystal semiconductor substrate or a polycrystalline semiconductor substrate in which silicon or silicon carbide is used; a compound semiconductor substrate of silicon germanium or the like; an SOI substrate; or the like can be used as the substrate 400, or the substrate provided with a semiconductor element can be used as the substrate 400.

Further, a flexible substrate may be used as the substrate 400. In the case where a flexible substrate is used, a transistor including an oxide semiconductor may be directly formed over a flexible substrate; or a transistor and the like are formed over a separation layer provided over another substrate, the formed transistor is separated with the separation layer, and then, may be transferred to the flexible substrate.

An insulating film serving as a base film may be provided between the substrate 400 and the gate electrode layer 401. The base film may have a function of preventing diffusion of impurity elements from the substrate 400, and can be formed to have a single-layer or stacked-layer structure using one or more of a silicon nitride film, a silicon oxide film, a silicon nitride oxide film, and a silicon oxynitride film.

The gate electrode layer 401 may be formed to have a single-layer structure or a stacked-layer structure using any of metal materials such as molybdenum, titanium, tantalum, tungsten, aluminum, copper, neodymium, and scandium, and an alloy material containing any of these materials as its main component by a plasma CVD method, a sputtering method, or the like.

Next, the aluminum oxide film 402a is formed over the gate electrode layer 401 by a plasma CVD method, a sputtering method, or the like. Then, the silicon oxide film 402b is formed over the aluminum oxide film 402a by a plasma CVD method, a sputtering method, or the like. Further, an oxide semiconductor film is formed over the silicon oxide film 402b and is processed into an island shape by a photolithography step or the like to be the oxide semiconductor layer 403. The formation process of the aluminum oxide film 402a through the oxide semiconductor film is preferably performed successively. It is further preferable that after the oxide semiconductor film is formed, heat treatment and oxygen adding treatment be successively performed in this order (see FIG. 2A). Accordingly, moisture or hydrogen in the films can be removed and oxygen can be added to the oxide semiconductor layer 403.

Further, as a gate insulating film, an insulating film may be formed, whose film quality and interface characteristics with the oxide semiconductor are improved by heat treatment which is performed after film formation. In either case, any gate insulating film can be used as long as film quality as a gate insulating film is high, interface state density with an oxide semiconductor is decreased, and a favorable interface can be formed.

Note that the gate insulating film preferably includes an oxygen-excess region because an oxygen vacancy in the oxide semiconductor layer 403 can be compensated.

The thickness of the oxide semiconductor layer 403 ranges from 2 nm to 200 nm, and preferably 5 nm to 30 nm. The oxide semiconductor layer 403 is non-single-crystal or amorphous and can be formed using the following oxides.

A metal oxide material containing two or more elements selected from In, Ga, Zn, and Sn may be used for the oxide semiconductor. As a material used for the oxide semiconductor, any of the following may be used, for example: a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; a single-component metal oxide such as an In—O-based material; a Sn—O-based material; a Zn—O-based material; and the like. In addition, any of the above oxide semiconductors may contain an element other than In, Ga, Sn, and Zn, for example, $SiO_2$.

Here, for example, an In—Ga—Zn—O-based oxide semiconductor means an oxide semiconductor containing indium (In), gallium (Ga), and zinc (Zn) and there is no particular limitation on the composition ratio thereof.

As the oxide semiconductor, a material expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, or Ga and Co.

In the case where an In—Zn—O-based material is used as an oxide semiconductor, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

The oxide semiconductor is in a single crystal state, a polycrystalline (also referred to as polycrystal) state, an amorphous state, or the like.

As the oxide semiconductor film, a c-axis aligned crystalline oxide semiconductor (CAAC-OS) film is used.

The CAAC-OS film is not completely single crystal nor completely amorphous. The CAAC-OS film is an oxide semiconductor film with a crystal-amorphous mixed phase structure where crystalline portions and amorphous portions are included in an amorphous phase. Note that in most cases, the crystalline portion fits inside a cube whose one side is less than 100 nm. From an observation image obtained with a transmission electron microscope (TEM), a boundary between an amorphous portion and a crystalline portion in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystalline portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystalline portions, the directions of the a-axis and the b-axis of one crystalline portion may be different from those of another crystalline portion. In this specification, a simple term "perpendicular" includes a range from 85° to 95°. In addition, a simple term "parallel" includes a range from −5° to 5°.

In the CAAC-OS film, distribution of crystalline portions is not necessarily uniform. For example, in the formation process of the CAAC-OS film, in the case where crystal growth occurs from a surface side of the oxide semiconductor film, the proportion of crystalline portions in the vicinity of the surface of the oxide semiconductor film is higher than that in the vicinity of the surface where the oxide semiconductor film is formed in some cases. Further, when an impurity is added to the CAAC-OS film, the crystalline portion in a region to which the impurity is added becomes amorphous in some cases.

Since the c-axes of the crystalline portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystalline portion is the direction parallel to a normal vector of the surface where the CAAC-OS film is formed or a normal vector of the surface of the CAAC-OS film. The crystalline portion is formed by film formation or by performing treatment for crystallization such as heat treatment after film formation.

With the use of the CAAC-OS film in a transistor, change in electric characteristics of the transistor due to irradiation with visible light or ultraviolet light can be reduced. Thus, the transistor has high reliability.

The oxide semiconductor film is formed by a sputtering method, a molecular beam epitaxy method, an atomic layer deposition method, or a pulsed laser deposition method. Here, the oxide semiconductor film can be formed by a sputtering method.

In order to form a CAAC-OS film as the oxide semiconductor film, the substrate 400 is heated during formation of the oxide semiconductor film. The temperature at which the substrate 400 is heated is higher than or equal to 150° C. and lower than or equal to 450° C.; preferably higher than or equal to 200° C. and lower than or equal to 350° C. When the substrate is heated at a high temperature during formation of the oxide semiconductor film, a CAAC-OS film in which the proportion of a crystalline portion is higher than the proportion of an amorphous portion can be formed.

In the formation of the oxide semiconductor film by a sputtering method, the concentration of hydrogen contained in the oxide semiconductor film is preferably reduced as much as possible. In order to reduce the hydrogen concentration, a high-purity rare gas (typically argon), high-purity oxygen, or a high-purity mixed gas of a rare gas and oxygen, from which impurities such as hydrogen, water, a hydroxyl group, and hydride are removed, is supplied into a treatment chamber of a sputtering apparatus as an atmosphere gas, as appropriate. The partial pressure of oxygen at this time is preferably higher and an atmosphere gas containing only oxygen may be used. Further, the treatment chamber may be evacuated with the use of a cryopump having high capability in evacuating water or a sputter ion pump having high capability in evacuating hydrogen.

In addition, the gate insulating film and the oxide semiconductor film are successively formed without exposure to the air. A surface where the gate insulating film is formed or the surface of the gate insulating film is preferably as flat as possible. Accordingly, the oxide semiconductor film can be easily a CAAC-OS film. The flatness of such a surface is arithmetic mean of absolute value of roughness (Ra) of 1 nm or less or preferably 0.5 nm or less. For example, the following may be performed: impurities containing hydrogen attached to a surface of the gate electrode layer 401 provided over the substrate 400 are removed by heat treatment or plasma treatment, and then the gate insulating film and the oxide semiconductor film are successively formed in this order without exposure to the air. In such a manner, impurities containing hydrogen attached to the surface of the gate electrode layer 401 can be reduced, and in addition, atmospheric components can be prevented from being attached to the interface between the gate electrode layer 401 and the aluminum oxide film 402*a* and the interface between the silicon oxide film 402*b* and the oxide semiconductor film. As a result, it is possible to manufacture the transistor 410 having favorable electric characteristics and high reliability.

Heat treatment (first heat treatment) is preferably performed after the oxide semiconductor film is formed. Excessive hydrogen (including water and a hydroxyl group) in the oxide semiconductor film is removed through the first heat treatment and the structure of the oxide semiconductor film is modified, so that defect levels in an energy gap can be reduced. The first heat treatment is performed at higher than or equal to 250° C. and lower than or equal to 700° C., preferably higher than or equal to 450° C. and lower than or equal to 600° C. or lower than the strain point of the substrate.

The heat treatment can be performed in such a manner that, for example, an object to be processed is introduced into an electric furnace in which a resistance heating element or the like is used and heated at 450° C. for 1 hour in a nitrogen atmosphere. During the heat treatment, the oxide semiconductor film is not exposed to the air to prevent entry of water and hydrogen.

A heat treatment apparatus is not limited to an electric furnace, and may an apparatus for heating an object to be processed by heat conduction or heat radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon, is used.

For example, as the first heat treatment, GRTA treatment may be performed as follows. An object to be processed is put in an inert gas atmosphere that has been heated, heated for several minutes, and taken out from the inert gas atmosphere. The GRTA treatment enables high-temperature heat treatment for a short time. Moreover, the GRTA treatment can be employed even when the temperature exceeds the upper temperature limit of the object to be processed.

Note that as the inert gas atmosphere, an atmosphere that contains nitrogen or a rare gas (such as helium, neon, or argon) as a main component and does not contain water, hydrogen, or the like is preferably used. For example, the purity of nitrogen or a rare gas such as helium, neon, or argon introduced into the heat treatment apparatus is higher than or equal to 6N (99.9999%), preferably higher than or equal to 7N (99.99999%) (that is, the impurity concentration is lower than or equal to 1 ppm, preferably lower than or equal to 0.1 ppm).

The above heat treatment (first heat treatment) can be referred to as dehydration treatment, dehydrogenation treatment, or the like because of its effect of removing hydrogen, water, and the like. Such dehydration treatment or dehydrogenation treatment may be performed more than once. Note that an inert gas may be switched to a gas containing oxygen during the first heat treatment. The first heat treatment is performed in an atmosphere containing oxygen, so that defect states in an energy gap caused by an oxygen vacancy can be reduced and the more i-type or substantially i-type oxide semiconductor layer can be formed.

Figure 2A:
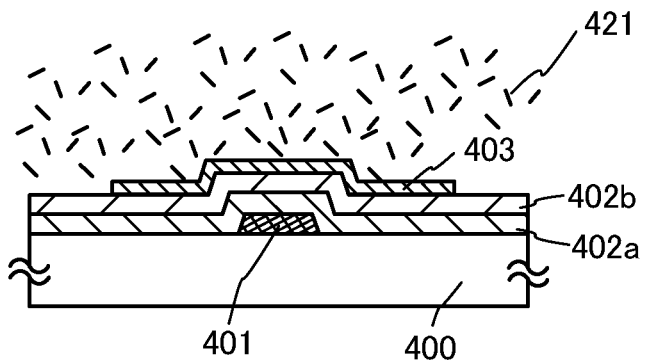
FIGS. 2A to 2D illustrate one embodiment of a method for manufacturing a semiconductor device.

Next, the oxide semiconductor layer 403 is subjected to adding treatment of an oxygen 421, so that an oxygen-excess region is formed (see FIG. 2A). By performing oxygen adding treatment, the oxygen 421 is supplied to the oxide semiconductor film and an oxygen-excess region is formed at least in part of any of the followings: the silicon oxide film 402*b*, the interface between the silicon oxide film 402*b* and the oxide semiconductor layer 403, the oxide semiconductor layer 403, or the interface between the oxide semiconductor layer 403 and the silicon oxide film 407*a* formed later. Formation of the oxygen-excess region in the oxide semiconductor layer 403 enables an oxygen vacancy to be immediately compensated. Thus, charge trapping centers in the oxide semiconductor layer 403 can be reduced.

The oxygen adding treatment is performed so that the amount of oxygen contained in the oxide semiconductor layer 403 exceeds that in the stoichiometric composition of the oxide semiconductor layer 403. For example, a peak of the concentration of oxygen in the oxide semiconductor layer 403, which is added by the oxygen adding treatment, is preferably higher than or equal to $1 \times 10^{18}/\text{cm}^3$ and lower than or equal to $3 \times 10^{21}/\text{cm}^3$ in the depth direction. The oxygen 421 which is added includes an oxygen radical, an oxygen atom, and/or an oxygen ion. Note that the oxygen-excess region may exist in part (including the interface) of the oxide semiconductor layer 403.

In the oxide semiconductor, oxygen is one of main component materials. Thus, it is difficult to accurately estimate the oxygen concentration of the oxide semiconductor by a method such as secondary ion mass spectrometry (SIMS). In other words, it can be said that it is hard to determine whether oxygen is intentionally added to the oxide semiconductor.

It is known that isotopes such as $^{17}\text{O}$ and $^{18}\text{O}$ exist in oxygen other than $^{16}\text{O}$ and that the proportions of $^{17}\text{O}$ and $^{18}\text{O}$ in all of the oxygen atoms in nature are approximately 0.037% and approximately 0.204%, respectively. That is to say, it is possible to measure the concentrations of these isotopes in the oxide semiconductor by a method such as SIMS; therefore, the oxygen concentration of the oxide semiconductor may be able to be estimated more accurately by measuring the concentration of such an isotope. Thus, the concentration of the isotope may be measured to determine whether oxygen is intentionally added to the oxide semiconductor.

Part of the oxygen 421 added to (contained in) the oxide semiconductor may have a dangling bond of oxygen in the oxide semiconductor. This is because such a dangling bond is bonded to hydrogen remaining in the oxide semiconductor so that hydrogen can be fixed (made to be an immovable ion).

Oxygen which is added (an oxygen radical, an oxygen atom, and/or an oxygen ion) may be supplied by a plasma generating apparatus with the use of a gas containing oxygen or by an ozone generating apparatus. More specifically, for example, the oxygen 421 can be generated with an apparatus for etching treatment on a semiconductor device, an apparatus for ashing on a resist mask, or the like to perform oxygen adding treatment on the oxide semiconductor film.

Alternatively, oxygen can be added by an ion doping method or an ion implantation method to the oxide semiconductor film and/or the silicon oxide film 402b which is the gate insulating film on the oxide semiconductor film side. When an oxygen-excess region is formed in the oxide semiconductor film, an oxygen vacancy can be compensated immediately. In addition, when an oxygen-excess region is formed in the silicon oxide film 402b, oxygen can be supplied to the oxide semiconductor film in heat treatment performed later. Note that the aluminum oxide film 402a in contact with the silicon oxide film 402b has a barrier property and moisture, oxygen, and another impurity are less likely to permeate the aluminum oxide film 402a, so that excessive oxygen in the silicon oxide film 402b can be supplied to the oxide semiconductor film.

Figure 2B:
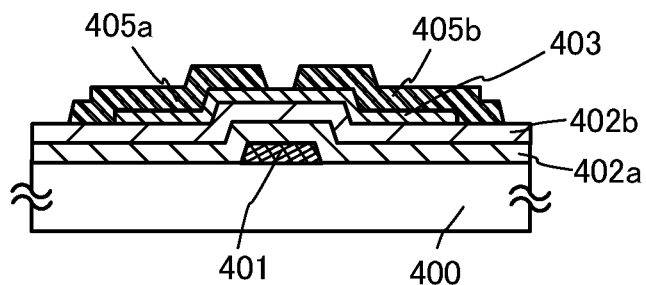
Figure 2C:
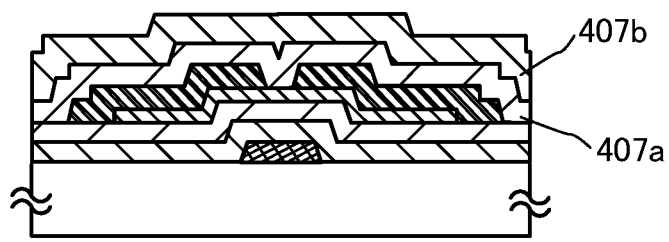

Next, a conductive film which is to be the source electrode layer and the drain electrode layer (including a wiring formed in the same layer as the source electrode layer and the drain electrode layer) is formed and is processed, so that the source electrode layer 405a and the drain electrode layer 405b are formed (see FIG. 2B).

The conductive film used for the source electrode layer 405a and the drain electrode layer 405b is formed using a material that can withstand a heat treatment step performed later. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. A metal film having a high melting point of Ti, Mo, W, or the like or a metal nitride film of any of these elements (a titanium nitride film, a molybdenum nitride film, or a tungsten nitride film) may be stacked on one of or both a lower side and an upper side of a metal film of Al, Cu, or the like. Alternatively, the conductive film used as the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials containing silicon oxide can be used.

Note that it is preferable that etching conditions be optimized so that the oxide semiconductor layer 403 is not etched and cut when the conductive film is etched. However, it is difficult to obtain the conditions for etching only the conductive film and not etching the oxide semiconductor layer 403 at all, and thus, the oxide semiconductor layer 403 has a groove (depression) in some cases.

Next, an insulating film which covers the source electrode layer 405a and the drain electrode layer 405b and is in contact with part of the oxide semiconductor layer 403 is formed. In order to dehydrate or dehydrogenate the oxide semiconductor layer 403, heat treatment may be performed, for example, at a temperature higher than or equal to 200° C. and lower than or equal to 450° C. before the insulating film is formed.

The insulating layer is a stack of the silicon oxide film 407a containing excessive oxygen ($SiO_x$, x>2) and the aluminum oxide film 407b containing excessive oxygen ($AlO_x$, x>3/2). The thickness of the silicon oxide film 407a is 400 nm, for example. Since aluminum oxide has a bather property and moisture, oxygen, and another impurity are less likely to permeate aluminum oxide, entry of impurities such as moisture from the outside after completion of the device can be prevented. Moreover, release of oxygen from the oxide semiconductor layer 403 can be prevented. This advantageous effect becomes further significant when the oxide semiconductor layer 403 is sandwiched between the aluminum oxide film 402a and the aluminum oxide film 407b. Note that the silicon oxide film 407a is not necessarily provided.

The silicon oxide film 407a and the aluminum oxide film 407b each have a thickness at least 1 nm and can be formed appropriately using a sputtering method or the like, i.e. a method in which impurities such as water and hydrogen do not enter the films. When hydrogen is contained in the silicon oxide film 407a and the aluminum oxide film 407b, the entry of the hydrogen into the oxide semiconductor layer 403 or extraction of oxygen from the oxide semiconductor layer 403 by the hydrogen may occur, whereby the backchannel of the oxide semiconductor layer 403 comes to have lower resistance (to be n-type), so that a parasitic channel may be formed. Therefore, it is important that a formation method in which hydrogen is not used be employed in order to form the silicon oxide film 407a and the aluminum oxide film 407b containing as little hydrogen as possible.

It is preferable to use a high-purity gas from which impurities such as hydrogen, water, a hydroxyl group, or hydride are removed as the sputtering gas when the silicon oxide film 407a and the aluminum oxide film 407b are formed.

Then, heat treatment (second heat treatment) is performed. The heat treatment is preferably performed at a temperature higher than or equal to 200° C. and lower than or equal to 650° C., further preferably higher than or equal to 450° C. and lower than or equal to 650° C. or lower than the strain point of the substrate, still further preferably higher than or equal to 275° C. and lower than or equal to 325° C. The heat treatment may be performed in an atmosphere of nitrogen, oxygen, ultra-dry air (air in which the water content is less than or equal to 20 ppm, preferably less than or equal to 1 ppm, further preferably less than or equal to 10 ppb), or a rare gas (such as argon or helium). Note that it is preferable that water, hydrogen, and the like be not contained in the atmosphere of nitrogen, oxygen, ultra-dry air, a rare gas, or the like. The purity of nitrogen, oxygen, or a rare gas which is introduced into a heat treatment apparatus is preferably set to be higher than or equal to 6N (99.9999%), further preferably higher than or equal to 7N (99.99999%) (that is, the impurity concentration is lower than or equal to 1 ppm, preferably lower than or equal to 0.1 ppm).

Through the above steps, the oxide semiconductor layer 403 in which formation of an oxygen vacancy is suppressed can be formed. By the second heat treatment, oxygen, which is one of main component materials of the oxide semiconductor, may be supplied from the silicon oxide film 402b and the silicon oxide film 407a which are insulating films containing oxygen to the oxide semiconductor layer 403. In the case where a CAAC-OS film is used as the oxide semiconductor layer 403, a crystal structure included in the oxide semiconductor layer 403 might be disordered by the oxygen adding treatment to be an amorphous structure; however, crystallinity can be recovered by performing heat treatment after the oxygen adding treatment.

Although the timing of the heat treatment (the second heat treatment) is not limited to that in this embodiment, the heat treatment needs to be performed at least after the aluminum oxide film 407b is formed. This is because, since the aluminum oxide film has a high blocking effect and thus both oxygen and impurities such as hydrogen and moisture less likely to permeate the aluminum oxide film, release of oxygen from the oxide semiconductor layer 403 can be prevented by performing the heat treatment after the aluminum oxide film 407b is formed.

As described above, at least one of the first heat treatment and the second heat treatment is performed, so that the oxide semiconductor layer 403 can be highly purified so as to contain impurities which are not main components as little as possible. The highly purified oxide semiconductor layer 403 contains extremely few (close to zero) carriers derived from a donor, and the carrier concentration thereof is lower than $1\times10^{14}/cm^3$, preferably lower than $1\times10^{12}/cm^3$, further preferably lower than $1\times10^{11}/cm^3$.

Figure 2D:
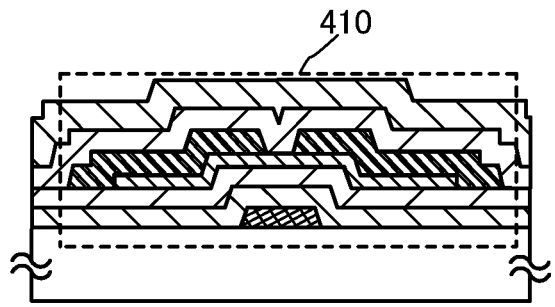

Through the above process, the transistor 410 is formed (see FIG. 2D). In the transistor 410, an oxygen-excess region is formed by the oxygen adding treatment, whereby formation of an oxygen vacancy in the inside of the oxide semiconductor layer 403 or the interface thereof can be suppressed and the number of donor levels in the energy gap due to an oxygen vacancy can be reduced or substantially zero. Further, when oxygen is supplied to the oxide semiconductor layer 403 by the oxygen adding treatment or the heat treatment after the oxygen adding treatment, an oxygen vacancy in the oxide semiconductor layer 403 can be compensated. Moreover, a hydrogen ion remaining in the oxide semiconductor layer 403 can be fixed by the supplied oxygen. Therefore, variation in the electric characteristics of the transistor 410 is suppressed and the transistor 410 is electrically stable.

Further, the transistor 410 is preferably subjected to heat treatment for dehydration or dehydrogenation, and can be a transistor including the oxide semiconductor layer 403 from which impurities such as hydrogen, water, a hydroxyl group, and hydride (also referred to as hydrogen compound) are intentionally removed by the heat treatment and is highly purified and becomes electrically i-type (intrinsic). The number of carriers in the highly purified oxide semiconductor layer 403 is significantly small (close to zero).

Figure 3A:
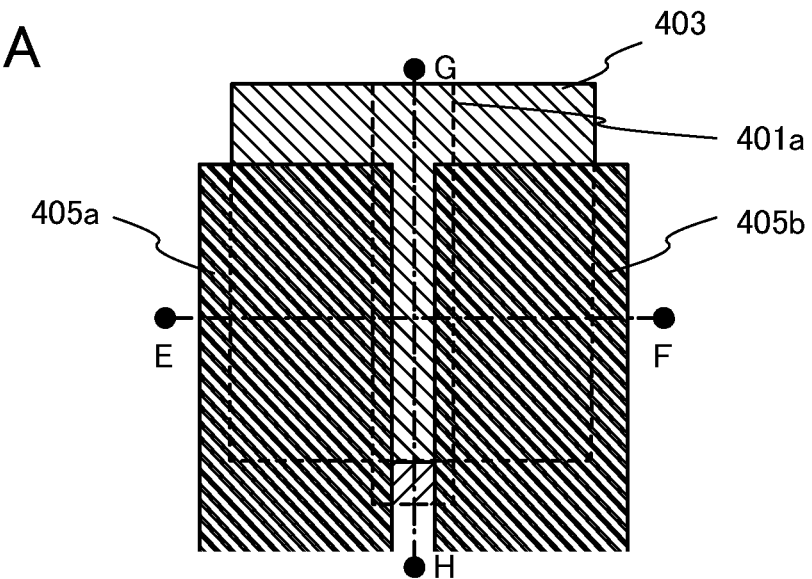
FIGS. 3A to 3C are a plan view and cross-sectional views which illustrate one embodiment of a semiconductor device.
Figure 3B:
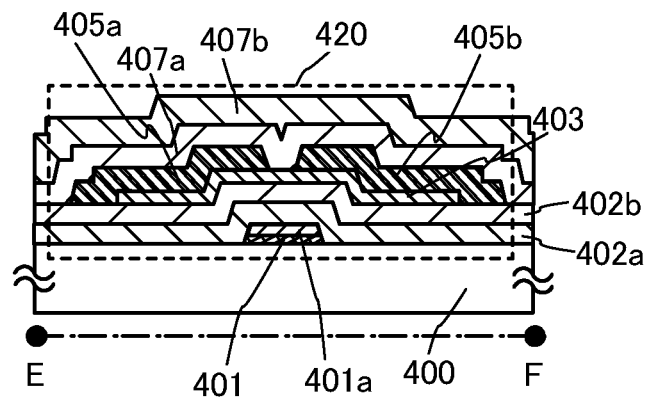
Figure 3C:
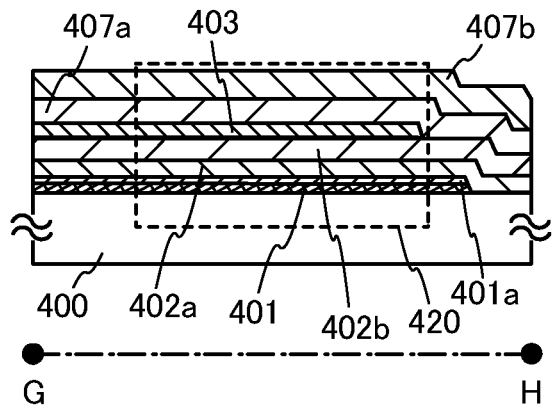

FIGS. 3A to 3C illustrate another structural example of a transistor according to this embodiment. FIG. 3A is a plan view of a transistor 420, and FIGS. 3B and 3C are cross-sectional views along line E-F and line G-H in FIG. 3A, respectively. Note that in FIG. 3A, some components of the transistor 420 (e.g., the silicon oxide film 407a, the aluminum oxide film 407b, and the like) are not illustrated in order to avoid complexity.

The transistor 420 in FIGS. 3A to 3C includes, as the transistor 410 in FIGS. 1A to 1C, over a substrate 400 having an insulating surface, a gate electrode layer 401, an aluminum oxide film 402a and a silicon oxide film 402b which constitute a gate insulating film, an oxide semiconductor layer 403, a source electrode layer 405a, a drain electrode layer 405b, and the silicon oxide film 407a and the aluminum oxide film 407b which constitute an insulating film.

One of the differences of the transistor 420 in FIGS. 3A to 3C from the transistor 410 in FIGS. 1A to 1C is that the gate electrode layer 401a is provided over the gate electrode layer 401. The formation method, a material, and the like of the gate electrode layer 401 can be referred to for those of the gate electrode layer 401a.

As a material layer in contact with the gate insulating film, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN) is preferably provided between the gate electrode layer and the gate insulating layer. These films each have a work function of 5 eV or higher, preferably 5.5 eV or higher; thus, the threshold voltage of the electric characteristics of the transistor can be positive. Accordingly, a so-called normally-off switching element can be obtained. For example, in the case where an In—Ga—Zn—O film containing nitrogen is used, an In—Ga—Zn—O film in which the nitrogen concentration higher than at least that of the oxide semiconductor layer 403, specifically an In—Ga—Zn—O film in which the nitrogen concentration is higher than or equal to 7 atomic % is used. Description of the transistor 410 can be referred to for the other details.

In the case of employing the structure illustrated in FIGS. 3A to 3C, an effect similar to that obtained in the case of employing the structure illustrated in FIGS. 1A to 1C can be obtained.

In the transistor described in this embodiment, when the amount of oxygen contained in the oxide semiconductor layer is increased by oxygen adding treatment and an oxygen vacancy is reduced, degradation due to electrical bias stress or thermal stress can be suppressed and degradation due to light can be reduced. Further, an oxygen-excess region is formed in the gate insulating layer adjacent to the oxide semiconductor layer by the oxygen adding treatment, whereby an oxygen vacancy in the oxide semiconductor layer can be compensated. Further, the oxide semiconductor layer is sandwiched between aluminum oxide films containing excessive oxygen, so that reduction in oxygen can be significantly suppressed. Furthermore, impurities containing a hydrogen atom such as hydrogen, water, a hydroxyl group, or hydride (also referred to as hydrogen compound) is removed from the oxide semiconductor by heat treatment mentioned above, so that the oxide semiconductor layer can be highly purified and become i-type (intrinsic). Inclusion of such an oxide semiconductor layer enables the transistor to have less fluctuation in electric characteristics such as threshold voltage and to be electrically stable.

As described above, according to this embodiment, a semiconductor device which is formed using an oxide semiconductor and has stable electric characteristics can be provided. Further, a semiconductor device with high reliability can be provided.

The methods and structures described in this embodiment can be combined as appropriate with any of the methods and structures described in the other embodiments.

(Embodiment 2)

In this embodiment, an example of a deposition apparatus for forming an oxide semiconductor layer and the like in the semiconductor device described in Embodiment 1 will be described with reference to FIGS. 4A to 4C, FIGS. 5A to 5C, and FIGS. 6A and 6B. Note that the same portion as or a portion having a function similar to that in Embodiment 1 can be formed as in Embodiment 1, and the same step as or a step similar to that in Embodiment 1 can be performed as in Embodiment 1, and thus repetitive description is omitted. In addition, detailed description of the same portion is not repeated.

FIG. 4A is a block diagram illustrating a structure of a deposition apparatus described in this embodiment.

In the deposition apparatus, a load chamber 101, a first deposition chamber 111, a second deposition chamber 112, a third deposition chamber 113, a heating chamber 114, an oxygen-supplying treatment chamber 115, and an unload chamber 102 are connected in this order. Note that hereinafter, except for the load chamber 101 and the unload chamber 102, each chamber may be collectively referred to as a treatment chamber when there is no need to distinguish them from each other. The deposition apparatus does not include a transfer robot and is similar to a belt conveyor in which a substrate is transferred to each treatment chamber in order and thus is also referred to as in-line apparatus.

A substrate 100 carried into the load chamber 101 is transferred through the first deposition chamber 111 to the oxygen-supplying treatment chamber 115 in order by a moving unit and is finally carried into the unload chamber 102. Treatment is not necessarily performed in each treatment chamber, and the substrate may be transferred to the next treatment chamber as appropriate without being processed if the step is skipped.

The load chamber 101 has a function of receiving the substrate from the outside into the deposition apparatus. The substrate 100 is, for example, carried horizontally into the load chamber 101, and then the substrate 100 is made to stand vertically with respect to a horizontal plane by a mechanism provided in the load chamber 101.

As an example, the unload chamber 102 may have, in contrast to the load chamber 101, a mechanism for laying the standing substrate 100 horizontally. After being processed, the substrate 100 is carried into the unload chamber 102 by the moving unit. The standing substrate 100 is laid horizontally in the unload chamber 102, and then carried out of the apparatus. Needless to say, the standing substrate 100 may be carried into the load chamber 101. Alternatively, the substrate 100 may remain lying horizontally and be subjected to treatment in each treatment chamber.

When the substrate 100 is made to stand in each treatment chamber, the substrate 100 is held so that an angle formed by a deposition surface of the substrate 100 and the vertical direction is in a range of greater than or equal to 1° and less than or equal to 30°, preferably greater than or equal to 5° and less than or equal to 15° while being carried from the load chamber 101 to the unload chamber 102 through treatment in each treatment chamber. The substrate 100 is inclined slightly against the vertical direction in this manner, whereby a so-called footprint, which is the floor area of the apparatus, can be reduced. As the substrate size is increased to, for example, a size of the eleventh generation or the twelfth generation, such a structure becomes more effective in cost and facility of designing of a clean room or the like. Moreover, it is preferable that the substrate 100 be inclined slightly against the vertical direction because dust or particles attached to the substrate 100 can be reduced.

The load chamber 101 and the unload chamber 102 each have an evacuation unit for evacuating the chamber to vacuum and a gas introduction unit which is used when the vacuum state is changed to the atmospheric pressure. As a gas introduced by the gas introduction unit, air or an inert gas such as nitrogen or a rare gas may be used as appropriate.

The load chamber 101 may have a heating unit for preheating the substrate 100. By preheating the substrate in parallel with the evacuation step, impurities such as a gas (including water, a hydroxyl group, and the like) adsorbed to the substrate 100 can be eliminated, which is preferable. As the evacuation unit, for example, an entrapment vacuum pump such as a cryopump, an ion pump, or a titanium sublimation pump or a turbo molecular pump provided with a cold trap is preferably used.

The load chamber 101, the unload chamber 102, and the treatment chambers are connected via gate valves. Therefore, when the substrate 100 is transferred to the next treatment chamber after being processed, the gate valve is opened so that the substrate 100 is carried into the next treatment chamber. Note that this gate valve is not necessarily provided unless needed between the treatment chambers. Each treatment chamber has an evacuation unit, a pressure adjusting unit, a gas introduction unit, and the like; thus, the treatment chamber can always be clean and under reduced pressure even when treatment is not performed therein. Each treatment chamber is isolated with the use of the gate valve and thus can be prevented from being contaminated by another treatment chamber.

In addition, the treatment chambers in the deposition apparatus are not necessarily arranged in one line. For example, the treatment chamber may be curved, and if needed, may be branched.

Next, a structure common to the first deposition chamber 111, the second deposition chamber 112, and the third deposition chamber 113 will be described. After that, a portion common to the heating chamber 114 and the oxygen-supplying-treatment chamber 115 will be described. Lastly, a feature of each treatment chamber will be described.

In each of the first to third deposition chambers, a sputtering apparatus or a CVD apparatus is provided.

As the sputtering apparatus used in the above deposition chamber, for example, a sputtering apparatus for a microwave sputtering method, an RF plasma sputtering method, an AC sputtering method, a DC sputtering method, or the like can be used.

Figure 5A:
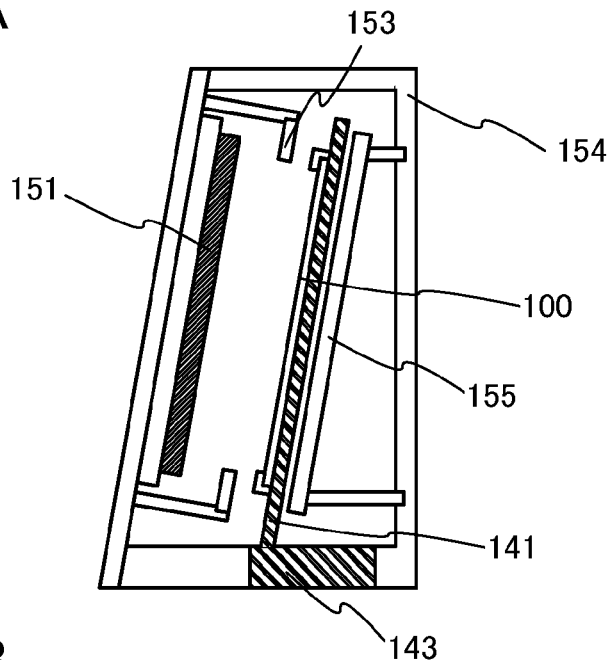
FIGS. 5A to 5C illustrate a deposition apparatus for a semiconductor device, according to one embodiment of the present invention.
Figure 5B:
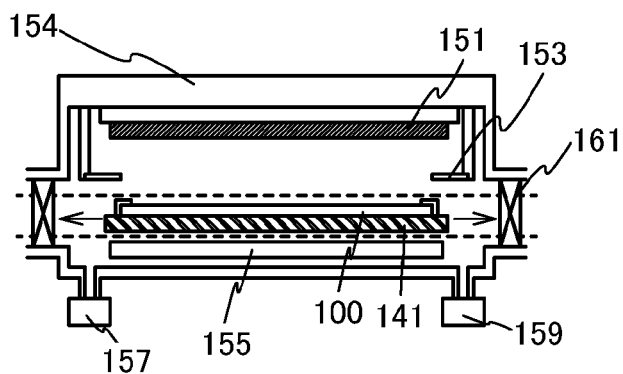

Here, an example of a deposition chamber using a DC sputtering method will be described with reference to FIGS. 5A to 5C. FIG. 5A is a schematic cross-sectional view of a deposition chamber 154 using a DC sputtering method, which is taken perpendicularly to the direction in which the substrate moves. FIG. 5B is a schematic cross-sectional view illustrating a cross section which is parallel to the direction in which the substrate moves and horizontal.

First, the substrate 100 is fixed by a substrate supporting portion 141 so that an angle formed by a deposition surface and the vertical direction is at least in a range of greater than or equal to 1° and less than or equal to 30°, preferably greater than or equal to 5° and less than or equal to 15°. The substrate supporting portion 141 is fixed to a moving unit 143. The moving unit 143 has a function of fixing the substrate supporting portion 141 so as to prevent the substrate from moving during treatment. Moreover, the moving unit 143 can move the substrate 100 along a dashed line in FIG. 5B (in the direction indicated by an arrow), and has a function of carrying the substrate 100 into and out of the load chamber 101, the unload chamber 102, and each treatment chamber.

In the deposition chamber 154, a target 151 and an attachment prevention plate 153 are arranged in parallel with the substrate 100. By arranging the target 151 and the substrate 100 in parallel, variation in the thickness of a sputtered film, variation in the step coverage with the sputtered film, and the like, which are caused owing to variation in the distance between the target and the substrate, can be reduced.

Further, the deposition chamber 154 may have a substrate heating unit 155 positioned behind the substrate supporting portion 141. With the substrate heating unit 155, deposition treatment can be performed while the substrate 100 is heated. As the substrate heating unit 155, for example, a resistance heater, a lamp heater, or the like can be used. Note that the substrate heating unit 155 can be omitted when not needed.

The deposition chamber 154 has a pressure adjusting unit 157, and the pressure in the deposition chamber 154 can be reduced to a desired pressure. As an evacuation apparatus used for the pressure adjusting unit, for example, an entrapment vacuum pump such as a cryopump, an ion pump, or a titanium sublimation pump or a turbo molecular pump provided with a cold trap may be used.

Further, the deposition chamber 154 has a gas introduction unit 159 for introducing a deposition gas or the like. For example, an oxide film can be formed in such a manner that a gas which includes a rare gas as a main component and to which oxygen is added is introduced, and deposition is performed by a reactive sputtering method. As the gas introduced by the gas introduction unit 159, a high-purity gas in which impurities such as hydrogen, water, and hydride are reduced can be used. For example, oxygen, nitrogen, a rare gas (typically argon), or a mixed gas of any of these can be introduced.

In the deposition chamber 154 having the pressure adjusting unit 157 and the gas introduction unit 159, a hydrogen molecule, a compound including hydrogen such as water ($H_2O$), (preferably, also a compound including a carbon atom), and the like are removed. Accordingly, the concentration of impurities in a film formed in the deposition chamber can be reduced.

The deposition chamber 154 and an adjacent chamber are separated by a gate valve 161. The chamber is isolated using the gate valve 161, so that impurities in the chamber can be easily eliminated and a clean deposition atmosphere can be maintained. Moreover, the gate valve 161 is opened and the substrate 100 is carried out of the chamber after the chamber is made clean, whereby contamination of an adjacent treatment chamber can be suppressed. Note that the gate valve 161 can be omitted when not needed.

Figure 5C:
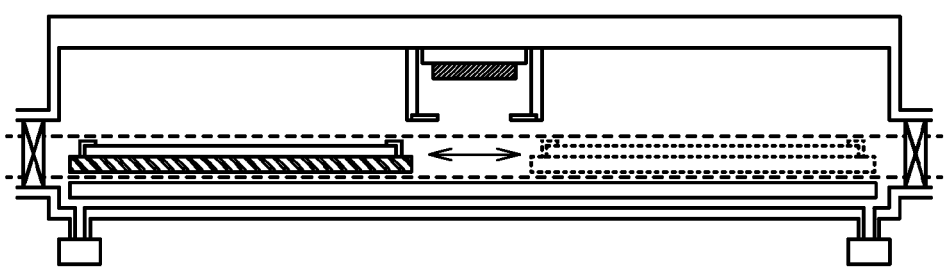

Note that the deposition chamber 154 may have a structure in which deposition is performed while the substrate 100 is slid along a dashed line in the drawing, i.e., in the direction of an arrow as illustrated in FIG. 5C. With such a structure, the size of the target can be reduced; therefore, such a structure is suitable for the case where a large-sized substrate is used but the size of a target cannot be approximately as large as the size of the substrate.

In the heating chamber 114, heat treatment can be performed on the substrate 100.

An apparatus using a resistance heater, a lamp, a heated gas, or the like is preferably provided as a heating apparatus.

Figure 6A:
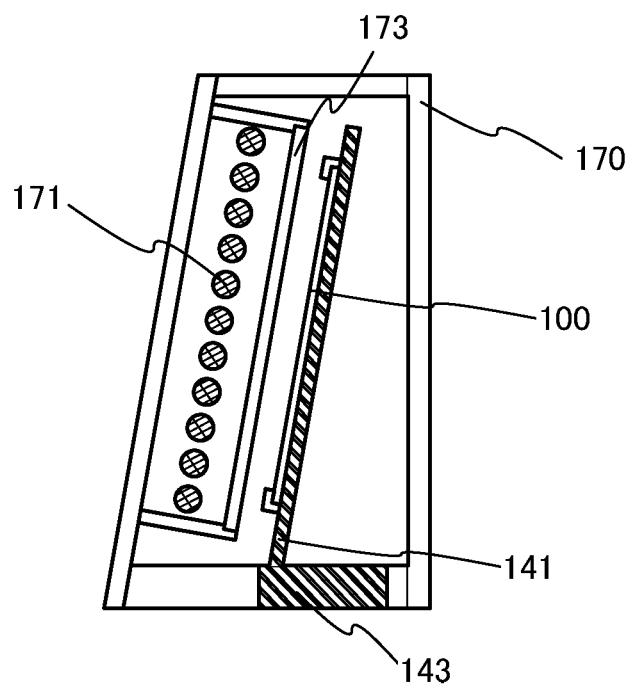
FIGS. 6A and 6B illustrate a deposition apparatus for a semiconductor device, according to one embodiment of the present invention.
Figure 6B:
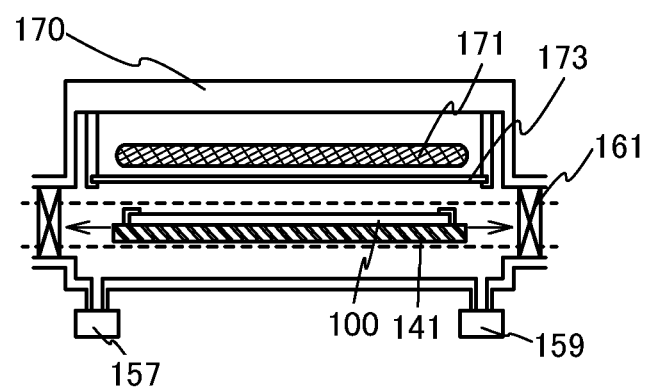

FIGS. 6A and 6B illustrate an example of a heating chamber to which a heating apparatus using a rod-shaped heater is applied. FIG. 6A is a schematic cross-sectional view of a heating chamber 170, which illustrates to a cross section perpendicular to the direction in which the substrate moves. FIG. 6B is a schematic cross-sectional view illustrating a cross section horizontal to the direction in which the substrate moves.

As in the deposition chamber 154, the substrate 100 supported by the substrate supporting portion 141 can be carried into and out of the heating chamber 170 by the moving unit 143.

In the heating chamber 170, rod-shaped heaters 171 are arranged in parallel with the substrate 100. FIG. 6A schematically illustrates the shape of a cross section of the rod-shaped heater 171. A resistance heater or a lamp heater can be used as the rod-shaped heater 171. The resistance heater includes the one using introduction heating. Further, it is preferable to use a lamp whose light has a center wavelength in the infrared region. By arranging the rod-shaped heaters 171 in parallel with the substrate 100, the distance therebetween can be uniform and heating can be performed uniformly. In addition, it is preferable that the temperature of the rod-shaped heaters 171 be individually controlled. For example, when a heater in a lower portion is set at a higher temperature than a heater in an upper portion, the substrate 100 can be heated at a uniform temperature. Note that the rod-shaped heater is used in this embodiment; however, the heater is not limited to having this structure and a planar (plate-shaped) heater may be used. Further, heat treatment can be performed while such a heater is moved. Alternatively, a heating method using a laser may be used.

In the heating chamber 170, a protection plate 173 is provided between the rod-shaped heaters 171 and the substrate 100. The protection plate 173 is provided in order to protect the rod-shaped heaters 171 and the substrate 100 and can be formed using quartz or the like, for example. The protection plate 173 is not necessarily provided unless needed. Note that a shutter plate is not provided between the rod-shaped heaters 171 and the substrate 100 in this structure, and thus the entire surface of the substrate can be uniformly heated.

Further, the heating chamber 170 has the pressure adjusting unit 157 and the gas introduction unit 159 as in the deposition chamber 154. Therefore, the heating chamber 170 can always be clean and under reduced pressure during heat treatment and even when treatment is not performed therein. In the heating chamber 170, a hydrogen molecule, a compound including hydrogen such as water ($H_2O$), (preferably, also a compound including a carbon atom), and the like are removed, whereby the concentration of impurities in a film processed in the heating chamber, those at an interface of the film, or those included in or adsorbed to a surface of the film can be reduced.

In addition, with the pressure adjusting unit 157 and the gas introduction unit 159, heat treatment in an inert gas atmosphere or an atmosphere containing oxygen can be performed. The oxygen-supplying-treatment chamber 115 also includes such units, so that oxygen supplying treatment can be performed in the oxygen-supplying-treatment chamber 115. Specifically, the oxygen supplying treatment is performed by a plasma doping method in which the atmosphere in the chamber is an oxygen plasma atmosphere, an ion doping method, or the like. Note that as the inert gas atmosphere, an atmosphere containing nitrogen or a rare gas (e.g., helium, neon, or argon) as its main component and not containing water, hydrogen, and the like is preferably used. For example, the purity of nitrogen or a rare gas such as helium, neon, or argon introduced into the heating chamber 170 is 6N (99.9999%) or higher, preferably 7N (99.99999%) or higher (i.e., the impurity concentration is 1 ppm or lower, preferably 0.1 ppm or lower).

Next, a feature and a structure which are peculiar in each treatment chamber will be described.

In the first deposition chamber 111, the aluminum oxide film 402a is formed over the substrate 100. A sputtering apparatus is employed as a deposition apparatus, for example. In the second deposition chamber 112, the silicon oxide film 402b is formed. A sputtering apparatus is employed as a deposition apparatus, for example. In the third deposition chamber 113, the oxide semiconductor layer 403 is formed. A sputtering apparatus is employed as a deposition apparatus, for example. As a deposition method, a microwave plasma sputtering method, an RF plasma sputtering method, an AC sputtering method, or a DC sputtering method can be employed.

In the heating chamber 114, the substrate 100 can be heated at a temperature lower than the softening point of the substrate 100 by the heater 171.

In the heating chamber 114, the substrate 100 can be heated at a temperature higher than or equal to 200° C. and lower than or equal to 700° C., for example. Further, with the pressure adjusting unit 157 and the gas introduction unit 159, heat treatment can be performed in an oxygen atmosphere, a nitrogen atmosphere, or a mixed atmosphere of oxygen and nitrogen, whose pressure is set to 10 Pa to 1 normal atmospheric pressure (1013.25 hPa), for example.

In the oxygen-supplying-treatment chamber 115, oxygen supplying treatment can be performed in an oxygen atmosphere. Note that the oxygen supplying treatment can be performed in a mixed atmosphere containing oxygen and another element, with the use of the pressure adjusting unit 157 and the gas introduction unit 159.

Next, the other deposition apparatus will be described with reference to a block diagram in FIG. 4B.

First, a feature and a structure which are peculiar in each treatment chamber will be described. A load chamber 201 and an unload chamber 202 are similar to those illustrated in FIG. 4A and description thereof is omitted.

In the first deposition chamber 211, the silicon oxide film 407a is formed. A sputtering apparatus is employed as the deposition apparatus, for example. In the second deposition chamber 212, the aluminum oxide film 407b is formed. A sputtering apparatus is employed as the deposition apparatus, for example. As a deposition method, a microwave plasma sputtering method, an RF plasma sputtering method, an AC sputtering method, or a DC sputtering method can be employed. Note that the silicon oxide film 407a is not necessarily provided.

In the heating chamber 213, the substrate 100 can be heated at a temperature lower than the softening point of the substrate 100 by the heater 171.

In the heating chamber 213, the substrate 100 is heated at a temperature higher than or equal to 275° C. and lower than or equal to 325° C., for example. Further, with the pressure adjusting unit 157 and the gas introduction unit 159, heat treatment can be performed in an oxygen atmosphere, a nitrogen atmosphere, or a mixed atmosphere of oxygen and nitrogen, whose pressure is set to 10 Pa to 1 normal atmospheric pressure (1013.25 hPa), for example.

The deposition apparatus illustrated in FIG. 4B can be replaced with another deposition apparatus. As an example, the deposition chamber will be described with reference to a block diagram in FIG. 4C.

First, a feature and a structure which are peculiar in each treatment chamber will be described. A load chamber 301 and an unload chamber 302 are similar to those illustrated in FIG. 4A and description thereof is omitted.

In a first deposition chamber 311, the silicon oxide film 407a is formed. A sputtering apparatus is employed as the deposition apparatus, for example. Then, in a second deposition chamber 312, a mixed film of an organic substance and a metal oxide is formed by, for example, a co-evaporation method. The mixed film has a thickness of, for example, greater than or equal to 10 nm and less than or equal to 50 nm. Specifically, the mixed film contains a high hole-transport substance and an acceptor substance. Note that the acceptor substance is preferably added so that the mass ratio of the acceptor substance to the high hole-transport substance is from 0.1:1 to 4.0:1.

As the acceptor substance, a transition metal oxide and an oxide of a metal belonging to Groups 4 to 8 of the periodic table can be given. Specifically, molybdenum oxide is particularly preferable. Note that molybdenum oxide has a low hygroscopic property.

As the substance having a high hole-transport property, any of a variety of organic compounds such as an aromatic amine compound, a carbazole derivative, an aromatic hydrocarbon, and a high molecular compound (such as an oligomer, a dendrimer, or a polymer) can be used. Specifically, a substance having a hole mobility of $10^{-6}$ cm$^2$/Vs or higher is preferably used. Note that substances other than the above described materials may also be used as long as the substances have higher hole-transport properties than electron-transport properties.

As a specific example of the substance having a high hole-transport property, the following can be given, for example: aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluoren-9-yl)triphenylamine (abbreviation: BPAFLP), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl-amino]-9-phenylcarbazole (abbreviation: PCzPCN1); and the like. Alternatively, the following carbazole derivative can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthryl)phenyl]-9H-carbazole (abbreviation: CzPA). The substances mentioned here are mainly ones that have a hole mobility of $10^{-6}$ cm$^2$/V·s or higher. Note that substances other than the above described materials may also be used as long as the substances have higher hole-transport properties than electron-transport properties. The layer containing a substance with a high hole-transport property is not limited to a single layer, and two or more layers containing the aforementioned substances may be stacked.

Further, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can also be used.

Alternatively, a film of a transparent conductive oxide (TCO) may be formed. Further alternatively, a material similar to that of the gate electrode layer 401a may be used. The thicknesses of such films are, for example, greater than or equal to 10 nm and less than or equal to 50 nm. Accordingly, shift of the threshold voltage of the transistor can be suppressed. The TCO film can be formed using, for example, a two-component compound such as $SnO_2$, $In_2O_3$, ZnO, or CdO or a three-component compound or a multi-component oxide containing at least one of Sn, In, Zn, and Cd. Alternatively, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, indium tin oxide to which silicon oxide is added, or graphene may be used. The film formed in the second deposition chamber 312 can prevent static electricity, so that shift of the threshold voltage of the transistor can be suppressed. In the third deposition chamber 313, the aluminum oxide film 407b is formed. A sputtering apparatus is employed as the deposition apparatus, for example. As a deposition method, a microwave plasma sputtering method, an RF plasma sputtering method, an AC sputtering method, or a DC sputtering method can be employed.

In the heating chamber 314, the substrate 100 can be heated at a temperature lower than the softening point of the substrate 100 by the heater 171.

In the heating chamber 314, the substrate 100 can be heated at a temperature higher than or equal to 275° C. and lower than or equal to 325° C., for example. Further, with the pressure adjusting unit 157 and the gas introduction unit 159, heat treatment can be performed in an oxygen atmosphere, a nitrogen atmosphere, or a mixed atmosphere of oxygen and nitrogen, whose pressure is set to 10 Pa to 1 normal atmospheric pressure (1013.25 hPa), for example.

The deposition apparatus described in this embodiment has a structure in which object is prevented from being exposed to the air thoroughly, from the load chamber through each treatment chamber to the unload chamber, and the substrate can always be transferred under clean and reduced-pressure environment. Therefore, the entry of impurities into an interface of a film formed with this deposition apparatus can be suppressed, so that a film whose interfacial state is extremely favorable can be formed. Note that if necessary, each treatment chamber may have a structure in which a mask can be provided over a substrate. Thus, a patterned film can be directly formed in the deposition apparatus.

An oxide semiconductor layer which is formed with the deposition apparatus described in this embodiment by a method shown below or the like is used for a semiconductor device such as a transistor, whereby a semiconductor device having stable electric characteristics and high reliability can be realized. Moreover, with the deposition apparatus described in this embodiment, formation steps of an oxide semiconductor layer can be successively performed without exposure to the air even on a large-sized substrate such as a mother glass with the use of a series of apparatuses in which the impurity concentration is reduced.

This embodiment can be implemented in an appropriate combination with any of the other embodiments described in this specification.

(Embodiment 3)

A semiconductor device having a display function (also referred to as display device) can be manufactured using the transistor described in Embodiment 1. Moreover, some or all of driver circuits which include transistors can be formed over a substrate where a pixel portion is formed, whereby a system-on-panel can be obtained.

Figure 8A:
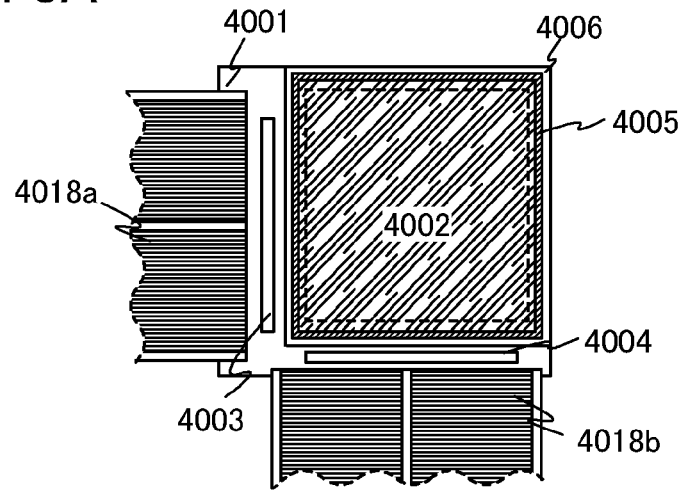
FIGS. 8A to 8C illustrate embodiments of a semiconductor device.

In FIG. 8A, a sealant 4005 is provided so as to surround a pixel portion 4002 provided over a first substrate 4001, and the pixel portion 4002 is sealed by the sealant 4005 and a second substrate 4006. In FIG. 8A, a signal line driver circuit 4003 and a scan line driver circuit 4004 which are each formed using a single crystal semiconductor film or a polycrystalline semiconductor film over a substrate prepared separately are mounted in regions that are different from the region surrounded by the sealant 4005 over the first substrate 4001. Various signals and potentials are supplied to the signal line driver circuit 4003, the scan line driver circuit 4004, and the pixel portion 4002 from flexible printed circuits (FPCs) 4018a and 4018b.

Figure 8B:
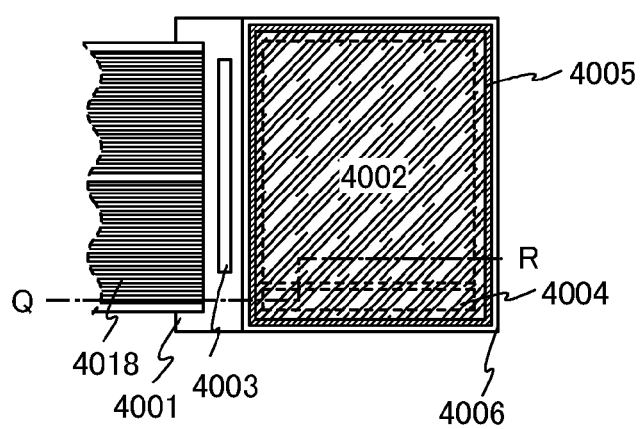
Figure 8C:
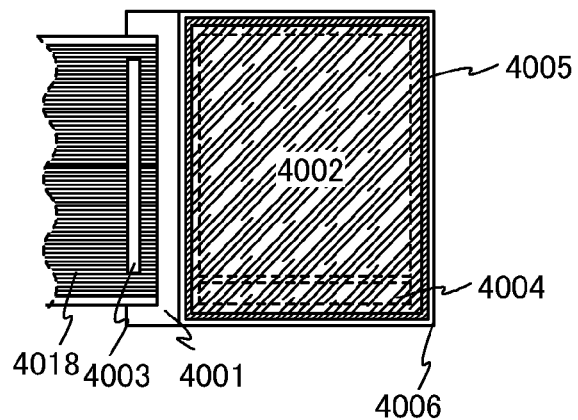

In FIGS. 8B and 8C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 including a display element and the scan line driver circuit 4004 are sealed together by the first substrate 4001, the sealant 4005, and the second substrate 4006. In FIGS. 8B and 8C, the signal line driver circuit 4003 which is formed using a single crystal semiconductor film or a polycrystalline semiconductor film over a substrate prepared separately is mounted in a region that is different from the region surrounded by the sealant 4005 over the first substrate 4001. In FIGS. 8B and 8C, various signals and potentials are supplied to the signal line driver circuit 4003, the scan line driver circuit 4004, and the pixel portion 4002 from an FPC 4018.

Although FIGS. 8B and 8C each illustrate an example in which the signal line driver circuit 4003 is formed separately and mounted on the first substrate 4001, one embodiment of the present invention is not limited to this structure. The scan line driver circuit may be formed separately and then mounted, or only part of the signal line driver circuit or part of the scan line driver circuit may be formed separately and then mounted.

Note that there is no particular limitation on the method of connecting a separately formed driver circuit, and a chip on glass (COG) method, a wire bonding method, a tape automated bonding (TAB) method, or the like can be used. FIG. 8A illustrates an example in which the signal line driver circuit 4003 and the scan line driver circuit 4004 are mounted by a COG method. FIG. 8B illustrates an example in which the signal line driver circuit 4003 is mounted by a COG method. FIG. 8C illustrates an example in which the signal line driver circuit 4003 is mounted by a TAB method.

In addition, the display device includes a panel in which the display element is sealed, and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and the transistor described in Embodiment 1 can be applied thereto.

As the display element provided in the display device, a liquid crystal element (also referred to as liquid crystal display element) or a light-emitting element (also referred to as light-emitting display element) can be used. The light-emitting element includes, in its category, an element whose luminance is controlled by current or voltage and specifically includes, in its category, an inorganic electroluminescent (EL) element, an organic EL element, and the like. Furthermore, a display medium whose contrast is changed by an electric effect, such as electronic ink, can be used.

Figure 9:
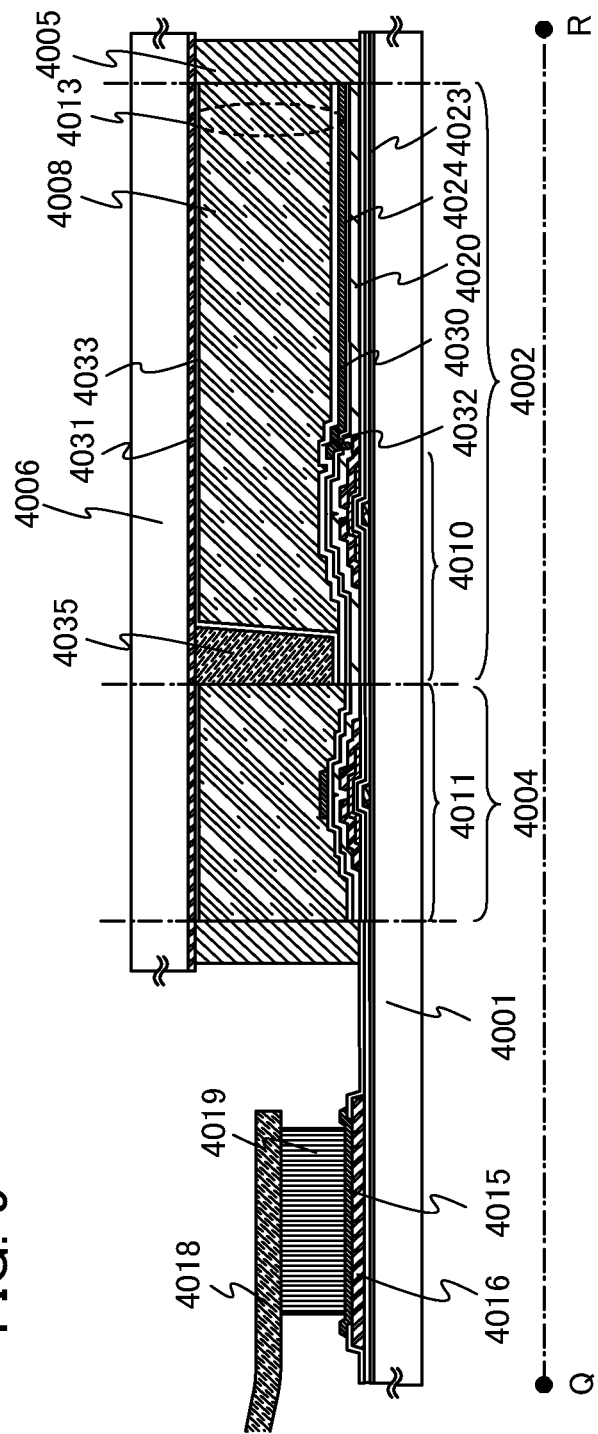
FIG. 9 illustrates one embodiment of a semiconductor device.
Figure 10:
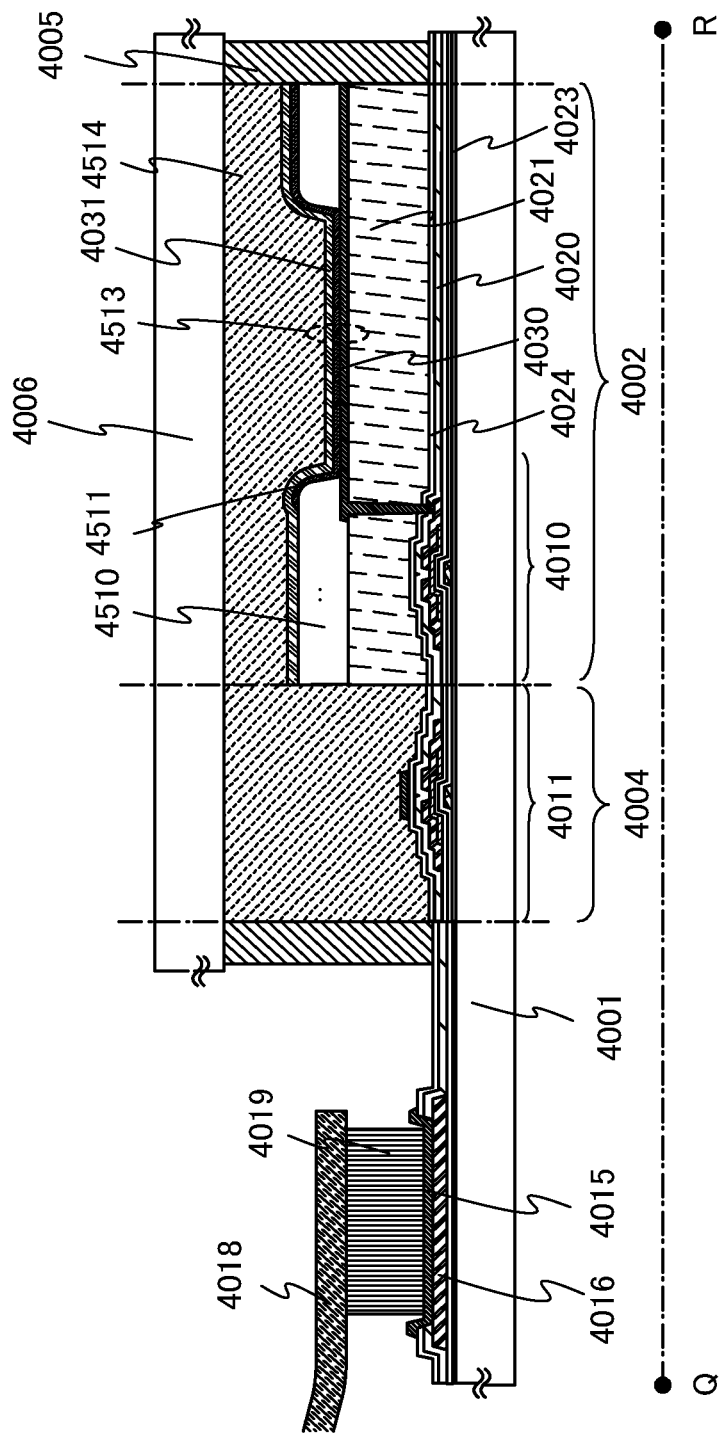
FIG. 10 illustrates one embodiment of a semiconductor device.
Figure 11:
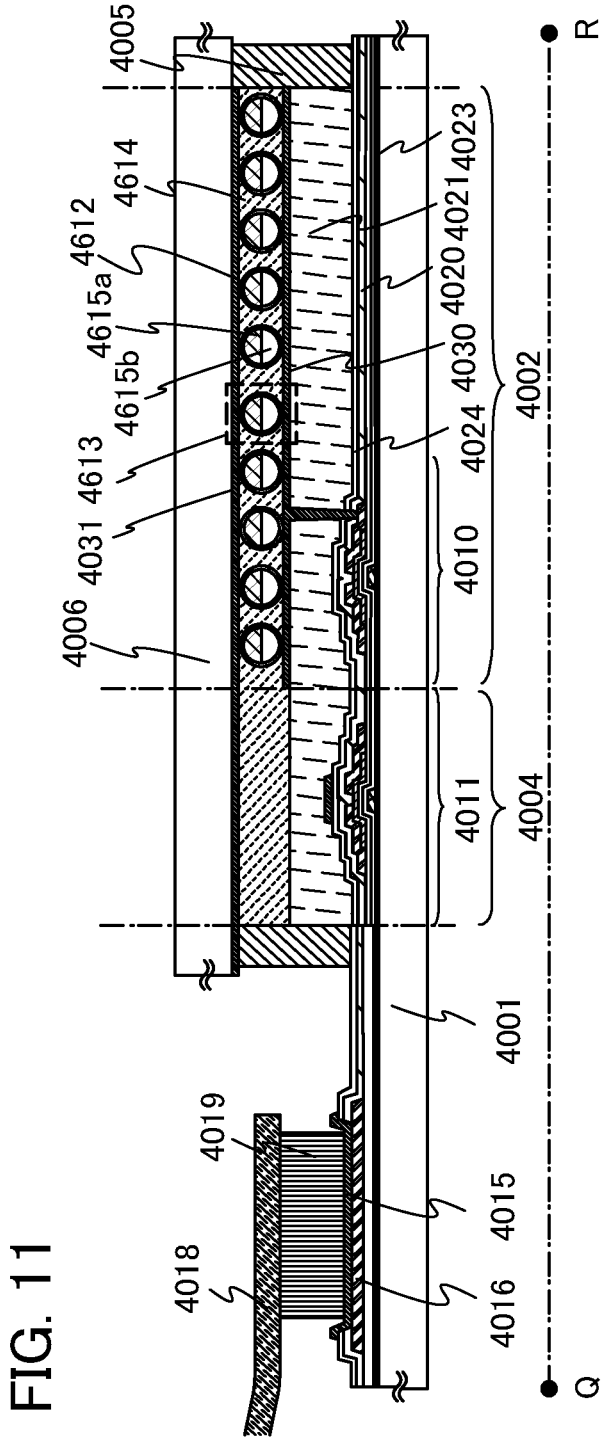
FIG. 11 illustrates one embodiment of a semiconductor device.

Embodiments of the semiconductor device will be described with reference to FIG. 9, FIG. 10, and FIG. 11. FIG. 9, FIG. 10, and FIG. 11 correspond to cross-sectional views along line Q-R in FIG. 8B.

As illustrated in FIG. 9, FIG. 10, and FIG. 11, the semiconductor device includes a connection terminal electrode layer 4015 and a terminal electrode layer 4016. The connection terminal electrode layer 4015 and the terminal electrode layer 4016 are electrically connected to a terminal included in the FPC 4018 through an anisotropic conductive film 4019.

The connection terminal electrode layer 4015 is formed using the same conductive film as a first electrode layer 4030, and the terminal electrode layer 4016 is formed using the same conductive film as source electrode layers and drain electrode layers of transistors 4010 and 4011.

The pixel portion 4002 and the scan line driver circuit 4004 which are provided over the first substrate 4001 include a plurality of transistors. In FIG. 9, FIG. 10, and FIG. 11, the transistor 4010 included in the pixel portion 4002 and the transistor 4011 included in the scan line driver circuit 4004 are illustrated as an example. In FIG. 9, an insulating film 4020 and an insulating film 4024 are provided over the transistors 4010 and 4011. In FIG. 10 and FIG. 11, an insulating film 4021 is further provided. Note that an insulating film 4023 is an insulating film functioning as a base film.

In this embodiment, the transistor described in Embodiment 1 can be applied to the transistor 4010 and the transistor 4011.

The transistor 4010 and the transistor 4011 are each a transistor including an oxide semiconductor film which is highly purified and in which formation of an oxygen vacancy is suppressed. Therefore, fluctuation in the electric characteristics of the transistor 4010 and the transistor 4011 is suppressed, and the transistor 4010 and the transistor 4011 are electrically stable.

Accordingly, highly reliable semiconductor devices can be provided as the semiconductor devices of this embodiment in FIG. 9, FIG. 10, and FIG. 11.

In addition, an example is described in this embodiment, in which a conductive layer is provided over the insulating film so as to overlap with a channel formation region of the oxide semiconductor film of the transistor 4011 for the driver circuit. By providing the conductive layer so as to overlap with the channel formation region of the oxide semiconductor film, the amount of change in the threshold voltage of the transistor 4011 by a BT test can be further reduced. The conductive layer may have the same potential as or a potential different from that of a gate electrode layer of the transistor 4011, and can function as a second gate electrode layer. The potential of the conductive layer may be GND or 0 V, or the conductive layer may be in a floating state.

In addition, the conductive layer functions to block an external electric field, that is, to prevent an external electric field (particularly, to prevent static electricity) from effecting the inside (a circuit portion including a thin film transistor). The blocking function of the conductive layer can prevent the fluctuation in electrical characteristics of the transistor due to the effect of external electric field such as static electricity. Note that the conductive layer may be formed in a wide range of area so as to overlap with the transistor 4011. Accordingly, the function of blocking static electricity is further improved.

The transistor 4010 provided in the pixel portion 4002 is electrically connected to a display element to form a display panel. A variety of display elements can be used as the display element as long as display can be performed.

An example of a liquid crystal display device using a liquid crystal element as a display element is illustrated in FIG. 9. In FIG. 9, a liquid crystal element 4013 which is a display element includes the first electrode layer 4030, a second electrode layer 4031, and a liquid crystal layer 4008. Insulating films 4032 and 4033 functioning as alignment films are provided so that the liquid crystal layer 4008 is interposed therebetween. The second electrode layer 4031 is provided on the second substrate 4006 side, and the first electrode layer 4030 and the second electrode layer 4031 are stacked with the liquid crystal layer 4008 interposed therebetween.

A columnar spacer 4035 is obtained by selective etching of an insulating film and is provided in order to control the thickness (cell gap) of the liquid crystal layer 4008. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which several weight percent or more of a chiral agent is mixed is used for the liquid crystal layer in order to improve the temperature range. The liquid crystal composition which includes a liquid crystal exhibiting a blue phase and a chiral agent has a short response time, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor formed using an oxide semiconductor film has a possibility that the electric characteristics of the transistor may fluctuate significantly by the influence of static electricity and deviate from the designed range. Therefore, it is more effective to use a liquid crystal material exhibiting a blue phase for the liquid crystal display device including the transistor formed using an oxide semiconductor film.

The specific resistivity of the liquid crystal material is higher than or equal to $1\times10^{9}$ $\Omega \cdot$cm, preferably higher than or equal to $1\times10^{11}$ $\Omega \cdot$cm, further preferably higher than or equal to $1\times10^{12}$ $\Omega \cdot$cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of the transistor or the like. By using a transistor including an oxide semiconductor film which is highly purified and in which formation of an oxygen vacancy is suppressed, it is enough to provide a storage capacitor having a capacitance that is ⅓ or less, preferably ⅕ or less of liquid crystal capacitance of each pixel.

In the transistor used in this embodiment, which includes an oxide semiconductor layer which is highly purified and in which formation of an oxygen vacancy is suppressed, the current in an off state (off-state current) can be made small. Accordingly, an electric signal such as an image signal can be held for a longer period, and a writing interval can be set longer in an on state. Accordingly, frequency of refresh operation can be reduced, which leads to an effect of suppressing power consumption.

The transistor used in this embodiment, which includes an oxide semiconductor layer which is highly purified and in which formation of an oxygen vacancy is suppressed, can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an ASV mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as organic EL element, and the latter is referred to as inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as current-excitation light-emitting element.

Inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is interposed between dielectric layers, which are further interposed between electrodes, and its light emission mechanism is localized type light emission that utilizes inner-shell electron transition of metal ions. Note that an example of an organic EL element is described here as a light-emitting element.

In order to extract light emitted from the light-emitting element, at least one of the pair of electrodes has a light-transmitting property. A transistor and a light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side, and a light-emitting element having any of these emission structures can be used.

An example of a light-emitting device in which a light-emitting element is used as a display element is illustrated in FIG. 10. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031, which is illustrated in FIG. 10. The structure of the light-emitting element 4513 can be changed as appropriate depending on the direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using either a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC (diamond like carbon) film, or the like can be formed. In addition, in a space which is formed with the first substrate 4001, the second substrate 4006, and the sealant 4005, a filler 4514 is provided for sealing. In this manner, a panel is preferably packaged (sealed) with a protective film (such as a laminate film or an ultraviolet curable resin film) or a cover material with high air-tightness and little degasification so that the panel is not exposed to the outside air.

As the filler 4514, an ultraviolet curable resin or a thermosetting resin can be used as well as an inert gas such as nitrogen or argon. For example, polyvinyl chloride (PVC), an acrylic resin, polyimide, an epoxy resin, a silicone resin, polyvinyl butyral (PVB), or ethylene vinyl acetate (EVA) can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, electronic paper in which electronic ink is driven can be provided as the display device. The electronic paper is also referred to as electrophoretic display device (electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain a pigment and do not move without an electric field. Moreover, the first particles and the second particles have different colors (which may be colorless).

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

FIG. 11 illustrates active matrix electronic paper as one embodiment of a semiconductor device. The electronic paper in FIG. 11 is an example of a display device using a twisting ball display system. The twisting ball display system refers to a method in which spherical particles each colored in black and white are arranged between electrode layers used for a display element, and a potential difference is generated between the electrode layers to control the orientation of the spherical particles, so that display is performed.

Between the first electrode layer 4030 connected to the transistor 4010 and the second electrode layer 4031 provided on the second substrate 4006, spherical particles 4613 each of which includes a particle including a black region 4615a and a white region 4615b, and a cavity 4612 wrapping the particle, and liquid filling between the particle and the cavity 4612 are provided. A space around the spherical particles 4613 is filled with a filler 4614 such as a resin. The second electrode layer 4031 corresponds to a common electrode layer (counter electrode layer). The second electrode layer 4031 is electrically connected to a common potential line.

Note that in FIG. 9, FIG. 10, and FIG. 11, a flexible substrate as well as a glass substrate can be used as the first substrate 4001 and the second substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is interposed between PVF films or polyester films can be used.

In this embodiment, a silicon oxide film is used as the insulating film 4020, and an aluminum oxide film is used as the insulating film 4024. The insulating film 4020 and the insulating film 4024 can be formed by a sputtering method or a plasma CVD method.

The aluminum oxide film provided as the insulating film 4024 over the oxide semiconductor layer has a high blocking effect and thus is less likely to transmit both oxygen and an impurity such as hydrogen or moisture.

Therefore, during the manufacturing process and after the manufacture, the aluminum oxide film functions as a protective film for preventing entry of an impurity such as hydrogen or moisture, which can cause a change, into the oxide semiconductor film and release of oxygen, which is a main component material of the oxide semiconductor, from the oxide semiconductor film.

The silicon oxide film provided as the insulating film 4020 in contact with the oxide semiconductor layer has a function of supplying oxygen to the oxide semiconductor layer. Therefore, the insulating film 4020 is preferably an oxide insulating film containing much oxygen.

The transistor 4010 and the transistor 4011 each include an oxide semiconductor layer which is highly purified and in which formation of an oxygen vacancy is suppressed. In addition, the transistor 4010 and the transistor 4011 each include an aluminum oxide film and a silicon oxide film as a gate insulating film. The oxide semiconductor layer included in each of the transistor 4010 and the transistor 4011 is obtained in such a manner that a region containing more oxygen than the stoichiometric composition is formed by oxygen adding treatment, and heat treatment is performed after the oxygen is added in a state where the aluminum oxide films are provided over and under the oxide semiconductor layer; therefore, oxygen can be prevented from being released from the oxide semiconductor layer by the heat treatment. Accordingly, the obtained oxide semiconductor layer can be a layer which includes a region containing more oxygen than the stoichiometric composition.

The oxide semiconductor layer included in each of the transistor 4010 and the transistor 4011 is a highly purified layer which is dehydrated or dehydrogenated by at least one of heat treatment performed after formation of the oxide semiconductor film and the heat treatment performed after the oxygen adding treatment. Accordingly, by using the oxide semiconductor layer for each of the transistor 4010 and the transistor 4011, fluctuation in the threshold voltage Vth of the transistors due to an oxygen vacancy and a shift of the threshold voltage ΔVth can be reduced.

Further, the insulating film 4021 functioning as a planarization insulating film can be formed using an organic material having heat resistance, such as an acrylic resin, polyimide, a benzocyclobutene-based resin, polyamide, or an epoxy resin. Other than such organic materials, it is also possible to use a low-dielectric constant material (low-k material), a siloxane-based resin, phosphosilicate glass (PSG), borophosphosilicate glass (BPSG), or the like. Alternatively, the insulating film 4021 may be formed by stacking a plurality of insulating films formed using any of these materials.

There is no particular limitation on the method of forming the insulating film 4021, and the following method or tool (equipment) can be used depending on the material: a sputtering method, an SOG method, spin coating, dipping, spray coating, a droplet discharge method (such as an inkjet method), a printing method (such as screen printing or offset printing), a doctor knife, a roll coater, a curtain coater, a knife coater, or the like.

The display device displays an image by transmitting light from a light source or a display element. Therefore, the substrate and the thin films such as the insulating film and the conductive film provided for the pixel portion where light is transmitted have light-transmitting properties with respect to light in the visible light wavelength range.

The first electrode layer and the second electrode layer (each of which may be called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, ITO, indium zinc oxide, indium tin oxide to which silicon oxide is added, or graphene.

The first electrode layer 4030 and the second electrode layer 4031 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also referred to as conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protection circuit for protecting the driver circuit is preferably provided. The protection circuit is preferably formed using a nonlinear element.

By using the transistor described in Embodiment 1 as described above, the semiconductor device can have a variety of functions.

(Embodiment 4)

A semiconductor device having an image sensor function of reading information on an object can be formed with the use of the transistor described in Embodiment 1.

Figure 12A:
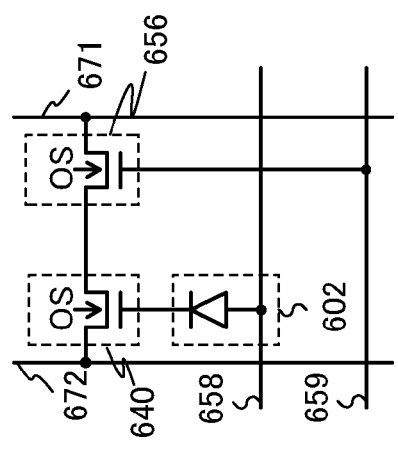
FIGS. 12A and 12B illustrate one embodiment of a semiconductor device.

An example of a semiconductor device having an image sensor function is illustrated in FIG. 12A. FIG. 12A illustrates an equivalent circuit of a photo sensor, and FIG. 12B is a cross-sectional view illustrating part of the photo sensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photo sensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photo sensor output signal line 671.

Note that in circuit diagrams in this specification, a transistor formed using an oxide semiconductor film is denoted by a symbol "OS" so that it can be identified as a transistor formed using an oxide semiconductor film. In FIG. 12A, the transistor 640 and the transistor 656 are each a transistor formed using an oxide semiconductor film in which an oxygen-excess region is formed by oxygen doping treatment, like the transistor described in Embodiment 1.

Figure 12B:
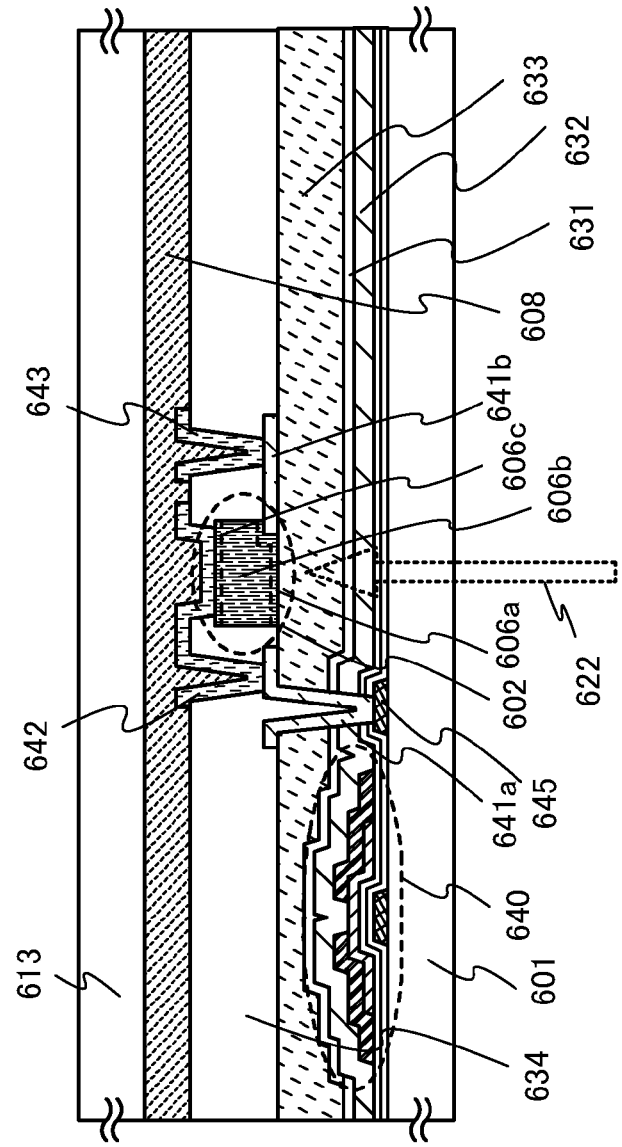

FIG. 12B is a cross-sectional view of the photodiode 602 and the transistor 640 in the photo sensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

An insulating film 631, an insulating film 632, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between an electrode layer 641b formed over the interlayer insulating film 633 and an electrode layer 642 formed over the interlayer insulating film 634. Note that the insulating film 632 is not necessarily provided.

The electrode layer 641b is electrically connected to a conductive layer 643 formed in the interlayer insulating film 634, and the electrode layer 642 is electrically connected to a gate electrode layer 645 through an electrode layer 641a. The gate electrode layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The microcrystalline semiconductor belongs to a metastable state of an intermediate between amorphous and single crystalline when Gibbs free energy is considered. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of microcrystalline silicon exists between 520 $cm^{-1}$ which represents single crystal silicon and 480 $cm^{-1}$ which represents amorphous silicon. In addition, microcrystalline silicon contains at least 1 at. % of hydrogen or halogen in order to terminate a dangling bond. Moreover, microcrystalline silicon contains a rare gas element such as helium, argon, krypton, or neon to further promote lattice distortion, so that stability is increased and a favorable microcrystalline semiconductor film can be obtained.

This microcrystalline semiconductor film can be formed by a high-frequency plasma CVD method with a frequency of several tens of megahertz to several hundreds of megahertz or using a microwave plasma CVD apparatus with a frequency of 1 GHz or higher. The microcrystalline semiconductor film can be typically formed using a dilution of silicon hydride or silicon halide such as $SiH_4$, $Si_2H_6$, $SiH_2Cl_2$, $SiHCl_3$, $SiCl_4$, or $SiF_4$ with hydrogen. With a dilution with one or a plural kinds of rare gas elements selected from helium, argon, krypton, and neon in addition to silicon hydride and hydrogen, the microcrystalline semiconductor film can be formed. In that case, the flow ratio of hydrogen to silicon hydride is 5:1 to 200:1, preferably 50:1 to 150:1, further preferably 100:1. Further, a carbide gas such as $CH_4$ or $C_2H_6$, a germanium gas such as $GeH_4$ or $GeF_4$, $F_2$, or the like may be mixed into the gas containing silicon.

In addition, the mobility of holes generated by a photoelectric effect is lower than the mobility of electrons. Therefore, a pin photodiode has better characteristics when a surface on the p-type semiconductor film side is used as a light-receiving plane. Here, an example in which light 622 received by the photodiode 602 from a surface of the substrate 601, over which the pin photodiode is formed, is converted into electric signals is described. Further, light from the semiconductor film having a conductivity type opposite to that of the semiconductor film on the light-receiving plane is disturbance light; therefore, the electrode layer is preferably formed using a light-blocking conductive film. Note that a surface on the n-type semiconductor film side can alternatively be used as the light-receiving plane.

With the use of an insulating material, the interlayer insulating film 633, and the interlayer insulating film 634 can be formed, depending on the material, using a method or a tool (equipment) such as a sputtering method, a plasma CVD method, an SOG method, spin coating, dipping, spray coating, a droplet discharge method (such as an inkjet method), a printing method (such as screen printing or offset printing), a doctor knife, a roll coater, a curtain coater, or a knife coater.

In this embodiment, an aluminum oxide film is used as the insulating film 631. The insulating film 631 can be formed by a sputtering method or a plasma CVD method.

The aluminum oxide film provided as the insulating film 631 over the oxide semiconductor film has a high blocking effect and thus is less likely to transmit both oxygen and an impurity such as hydrogen or moisture.

Therefore, during the manufacturing process and after the manufacture, the aluminum oxide film functions as a protective film for preventing entry of an impurity such as hydrogen or moisture, which can cause a change, into the oxide semiconductor layer and release of oxygen, which is a main component material of the oxide semiconductor, from the oxide semiconductor layer.

In this embodiment, the transistor 640 includes an oxide semiconductor layer which is highly purified and in which formation of an oxygen vacancy is suppressed. In addition, the transistor 640 includes a silicon oxide film as a gate insulating film. The oxide semiconductor layer included in the transistor 640 is obtained in such a manner that a region containing more oxygen than the stoichiometric composition is formed by oxygen adding treatment, and heat treatment is performed after the oxygen is added in a state where the aluminum oxide film is provided as the insulating film 631 over the oxide semiconductor layer; therefore, oxygen can be prevented from being released from the oxide semiconductor layer by the heat treatment. Accordingly, the obtained oxide semiconductor layer can be a film which includes a region containing more oxygen than the stoichiometric composition.

The oxide semiconductor layer included in the transistor 640 is a highly purified film which is dehydrated or dehydrogenated by at least one of heat treatment performed after formation of the oxide semiconductor layer and the heat treatment performed after the oxygen adding treatment. Accordingly, by using the oxide semiconductor layer for the transistor 640, fluctuation in the threshold voltage Vth of the transistor due to an oxygen vacancy and a shift of the threshold voltage ΔVth can be reduced.

The insulating film 632 can be formed using an inorganic insulating material and can have a single-layer structure or a stacked-layer structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer. Further, a mixed film of an organic substance and metal oxide, a TCO film, or the like may be formed thereover. Alternatively, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN) may be provided. Accordingly, effect of blocking static electricity can be further increased, so that a transistor with higher performance capabilities can be obtained.

For a reduction in surface roughness, an insulating film functioning as a planarization insulating film is preferably used as each of the interlayer insulating films 633 and 634. For the interlayer insulating films 633 and 634, for example, an organic insulating material having heat resistance such as polyimide, an acrylic resin, a benzocyclobutene-based resin, polyamide, or an epoxy resin can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

With detection of light that enters the photodiode 602, information on an object to be detected can be read. Note that a light source such as a backlight can be used at the time of reading information on the object to be detected.

As described above, fluctuation in the electric characteristics of a transistor including a highly purified oxide semiconductor layer in which formation of an oxygen vacancy is suppressed, and the transistor is electrically stable. Thus, by using the transistor, a highly reliable semiconductor device can be provided.

This embodiment can be implemented in appropriate combination with any of the structures described in the other embodiments.

(Embodiment 5)

The transistor described in Embodiment 1 can be favorably used for a semiconductor device including an integrated circuit in which a plurality of transistors is stacked. In this embodiment, as an example of the semiconductor device, a memory medium (memory element) will be described.

In this embodiment, a semiconductor device including a first transistor which is formed using a single crystal semiconductor substrate and a second transistor which is formed using a semiconductor film and is provided above the first transistor with an insulating film positioned between the first transistor and the second transistor is manufactured.

Figure 7A:
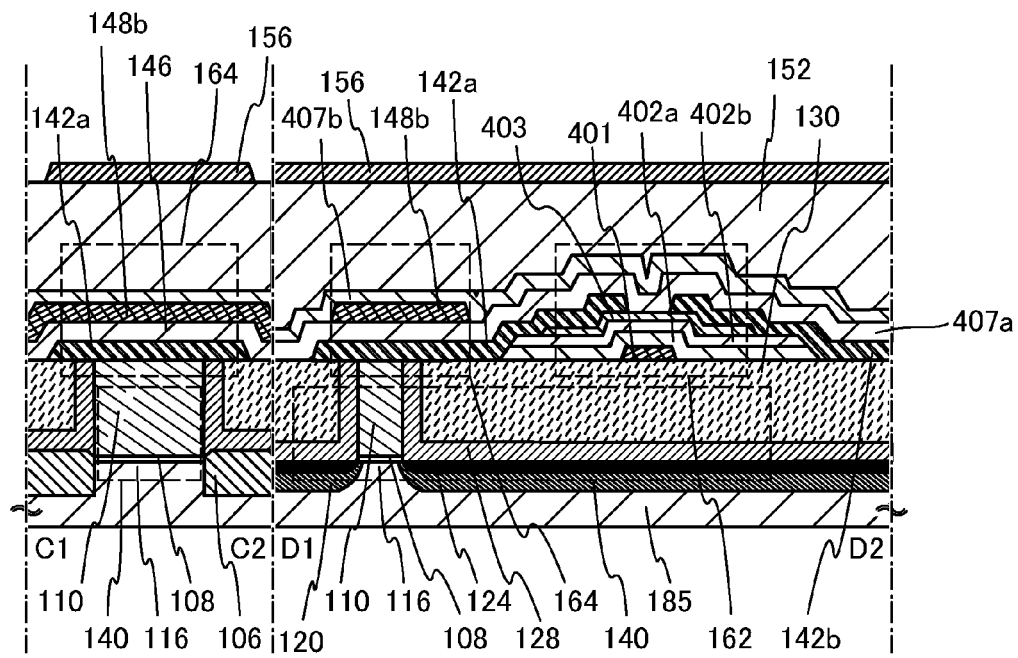
FIGS. 7A to 7C illustrate one embodiment of a semiconductor device.
Figure 7B:
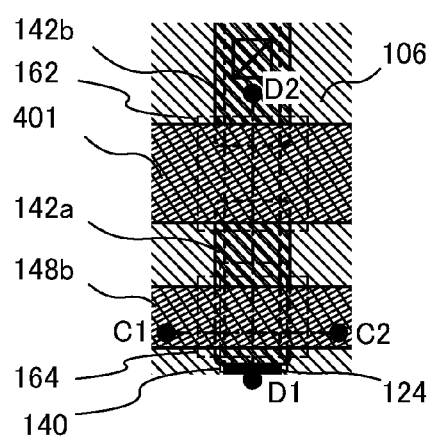
Figure 7C:
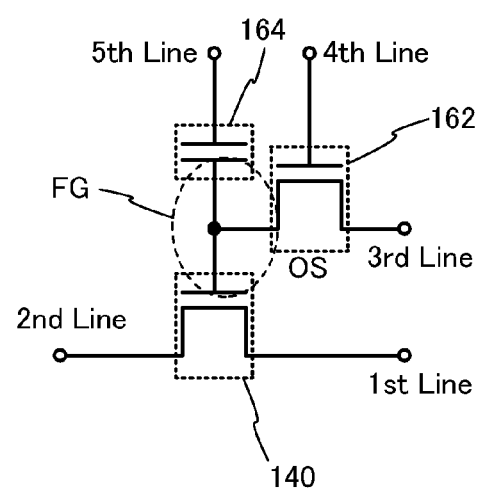

FIGS. 7A to 7C illustrate an example of a structure of a semiconductor device. FIG. 7A illustrates a cross section of the semiconductor device, and FIG. 7B illustrates a plan view of the semiconductor device. Here, FIG. 7A corresponds to a cross section along line C1-C2 and line D1-D2 in FIG. 7B. FIG. 7C is an example of a diagram of a circuit using the semiconductor device as a memory element.

The semiconductor device illustrated in FIGS. 7A and 7B includes a transistor 140 formed using a first semiconductor material in a lower portion, and a transistor 162 formed using a second semiconductor material in an upper portion. The transistor described in Embodiment 1 can be favorably used as the transistor 162.

Semiconductor materials and structures of the transistor 140 and the transistor 162, which are stacked, may be the same or different. In this embodiment, an example is described in which materials and structures which are appropriate for the circuit of the memory medium (memory element) are employed for the transistors; here, the first semiconductor material is a semiconductor material other than an oxide semiconductor, and the second semiconductor material is an oxide semiconductor. As the semiconductor material other than an oxide semiconductor, for example, silicon, germanium, silicon germanium, silicon carbide, or gallium arsenide can be used, and a single crystal semiconductor is preferably used. Alternatively, an organic semiconductor material or the like may be used. A transistor formed using such a semiconductor material can operate at high speed easily. On the other hand, a transistor formed using an oxide semiconductor can hold charge for a long time owing to its characteristics.

The transistor 140 includes a channel formation region 116 provided in a substrate 185 containing a semiconductor material (e.g., silicon), impurity regions 120 provided so that the channel formation region 116 is interposed therebetween, metal compound regions 124 in contact with the impurity regions 120, a gate insulating film 108 provided over the channel formation region 116, and a gate electrode layer 110 provided over the gate insulating film 108.

As the substrate 185 containing a semiconductor material, a single crystal semiconductor substrate or a polycrystalline semiconductor substrate in which silicon or silicon carbide is used; a compound semiconductor substrate of silicon germanium or the like; an SOI substrate; or the like can be used. Note that although the term "SOI substrate" generally means a substrate in which a silicon semiconductor film is provided over an insulating surface, the term "SOI substrate" in this specification and the like also includes a substrate in which a semiconductor film formed using a material other than silicon is provided over an insulating surface. That is, a semiconductor film included in the "SOI substrate" is not limited to a silicon semiconductor film. Moreover, the SOI substrate can be a substrate having a structure where a semiconductor film is provided over an insulating substrate such as a glass substrate with an insulating film positioned therebetween.

As a method of forming the SOI substrate, any of the following methods can be used: a method in which oxygen ions are implanted into a minor-polished wafer and then heating is performed at a high temperature, whereby an oxide layer is formed at a certain depth from a surface of the wafer and a defect caused in the surface layer is eliminated; a method in which a semiconductor substrate is separated by utilizing a phenomenon in which microvoids formed by hydrogen ion irradiation grow because of heat treatment; a method in which a single crystal semiconductor film is formed over an insulating surface by crystal growth; and the like.

For example, ions are added through one surface of a single crystal semiconductor substrate, an embrittlement layer is formed at a certain depth from the surface of the single crystal semiconductor substrate, and an insulating film is formed over one of the surface of the single crystal semiconductor substrate and an element substrate. Heat treatment is performed in a state where the single crystal semiconductor substrate and the element substrate are bonded to each other with the insulating film interposed therebetween, so that a crack is generated in the embrittlement layer and the single crystal semiconductor substrate is separated along the embrittlement layer. Accordingly, a single crystal semiconductor film, which is separated from the single crystal semiconductor substrate, is formed as a semiconductor film over the element substrate. An SOI substrate formed by the above method can also be favorably used.

An element isolation insulating film 106 is provided over the substrate 185 so as to surround the transistor 140. Note that for high integration, it is preferable that, as in FIGS. 7A to 7C, the transistor 140 do not include a sidewall insulating film. On the other hand, in the case where the characteristics of the transistor 140 have priority, a sidewall insulating film may be provided on a side surface of the gate electrode layer 110, and the impurity region 120 may include a region having a different impurity concentration.

The transistor 140 formed using a single crystal semiconductor substrate can operate at high speed. Thus, when the transistor is used as a reading transistor, data can be read at high speed.

In this embodiment, two insulating films are formed so as to cover the transistor 140. Note that an insulating film which covers the transistor 140 may also have a single-layer structure or a stacked-layer structure of three or more layers. Note also that a silicon oxide film is used as an insulating film in contact with an oxide semiconductor film included in the transistor 162 which is provided in the upper portion.

As treatment prior to formation of the transistor 162 and a capacitor 164, CMP treatment is performed on the two insulating films, whereby an insulating film 128 and an insulating film 130 which are planarized are formed and, at the same time, an upper surface of the gate electrode layer 110 is exposed.

As each of the insulating film 128 and the insulating film 130, typically, it is possible to use an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating film 128 and the insulating film 130 can be formed by a plasma CVD method, a sputtering method, or the like.

Alternatively, an organic material such as polyimide, an acrylic resin, or a benzocyclobutene-based resin can be used. Other than such organic materials, it is also possible to use a low-dielectric constant material (low-k material) or the like. In the case of using an organic material, the insulating film 128 and the insulating film 130 may be formed by a wet method such as a spin coating method or a printing method.

In this embodiment, a 50-nm-thick silicon oxynitride film is formed as the insulating film 128 by a sputtering method, and a 550-nm-thick silicon oxide film is formed as the insulating film 130 by a sputtering method.

After that, a conductive film is formed over the insulating film 130 which is sufficiently planarized by the CMP treatment and is processed, so that an island-shaped gate electrode layer 401 is formed. Then, the aluminum oxide film 402a, the silicon oxide film 402b, and the oxide semiconductor film are stacked in this order. These are successively formed in an in-line apparatus, as described in Embodiment 2. Then, heat treatment and oxygen supplying treatment as described in Embodiment 1 are successively performed in the in-line apparatus. These treatments in the in-line apparatus are successively performed without exposure to the air. Accordingly, each time interval between the treatments can be extremely shortened as compared to that in the case of using a cluster apparatus, so that the amount of impurities accumulated at each interface between the layers can be extremely reduced. After that, these films are selectively etched and thus an oxide semiconductor layer 403 and the like are formed.

Next, a conductive layer is formed and selectively etched, so that a source or drain electrode layer 142a and a source or drain electrode layer 142b are formed. Each of them corresponds to either the source electrode layer 405a or the drain electrode layer 405b described in Embodiment 1.

The conductive layer can be formed by a PVD method such as a sputtering method or a CVD method such as a plasma CVD method. Further, as a material of the conductive layer, an element selected from Al, Cr, Cu, Ta, Ti, Mo, and W, an alloy containing any of the above elements as a component, or the like can be used. Any of Mn, Mg, Zr, Be, Nd, and Sc, or a material containing any of these in combination may be used.

The conductive layer may have a single-layer structure or a stacked-layer structure of two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that the conductive layer having a single-layer structure of a titanium film or a titanium nitride film has an advantage in that it can be easily processed into the source or drain electrode layer 142a and the source or drain electrode layer 142b having a tapered shape.

The channel length (L) of the transistor 162 in the upper portion is determined by the distance between a lower edge portion of the source or drain electrode layer 142a and a lower edge portion of the source or drain electrode layer 142b. Note that for light exposure for forming a mask used in the case where a transistor with a channel length (L) less than 25 nm is formed, it is preferable to use extreme ultraviolet rays whose wavelength is as short as several nanometers to several tens of nanometers.

Next, the silicon oxide film 407a in contact with part of the oxide semiconductor layer 403 is formed by a plasma CVD method, a sputtering method, or the like. Alternatively, a film containing oxygen such as a silicon oxide film, a silicon oxynitride film, a silicon nitride oxide film, or a hafnium oxide film can be formed instead of the silicon oxide film 407a.

Next, an electrode layer 148b is formed to overlap with the source or drain electrode layer 142a, over the silicon oxide film 407a. At this time, the steps of forming from the silicon oxide film 407a through the aluminum oxide film 407b which is formed later are performed without exposure to the air in the in-line apparatus described in Embodiment 2; thus, another deposition chamber for forming the conductive film needs to be provided between the deposition chambers for forming these films. Specifically, the deposition chamber is provided between the first deposition chamber 211 and the second deposition chamber 212 or between the second deposition chamber 312 and the third deposition chamber 313. The deposition chamber needs to have a structure in which a mask can be attached and detached so that the conductive layer can have a pattern.

The electrode layer 148b can be formed in such a manner that the conductive layer is formed over the silicon oxide film 407a and then is etched selectively.

Next, an insulating film 150 including an aluminum oxide film is formed over the silicon oxide film 407a and the electrode layer 148b. The aluminum oxide film corresponds to the aluminum oxide film 407b described in Embodiment 1. In the case where the insulating film 150 has a stacked-layer structure, a stack of the aluminum oxide film and a silicon oxide film, a silicon nitride film, a silicon oxynitride film, a silicon nitride oxide film, an aluminum nitride film, an aluminum oxynitride film, an aluminum nitride oxide film, a hafnium oxide film, or a gallium oxide film may be formed by a plasma CVD method, a sputtering method, or the like.

After the insulating film 150 is formed, heat treatment is performed. The heat treatment is preferably performed at a temperature higher than or equal to 200° C. and lower than or equal to 650° C., further preferably higher than or equal to 450° C. and lower than or equal to 650° C. or lower than the strain point of the substrate, still further preferably higher than or equal to 275° C. and lower than or equal to 325° C. The aluminum oxide film used in the insulating film 150 has a high blocking effect and thus both oxygen and impurities such as hydrogen and moisture less likely to permeate the aluminum oxide film. Accordingly, release of oxygen from the oxide semiconductor layer 403 can be prevented by performing the heat treatment after the insulating film 150 is formed.

Next, an insulating film 152 is formed over the transistor 162 and the insulating film 150. The insulating film 152 can be formed by a sputtering method, a CVD method, or the like. The insulating film 152 can be formed using a material including an inorganic insulating material such as silicon oxide, silicon oxynitride, silicon nitride, hafnium oxide, or aluminum oxide.

Next, an opening reaching the source or drain electrode layer 142b is formed in the silicon oxide film 407a, the insulating film 150, and the insulating film 152. The opening is formed by selective etching with the use of a mask or the like.

Then, a wiring 156 is formed in the opening so that the wiring 156 is in contact with the source or drain electrode layer 142b. Note that the connection portion between the source or drain electrode layer 142b and the wiring 156 is not illustrated in FIGS. 7A to 7C.

The wiring 156 is formed in such a manner that a conductive layer is formed by a PVD method such as a sputtering method or a CVD method such as a plasma CVD method and then the conductive layer is etched. Further, as the material of the conductive layer, an element selected from Al, Cr, Cu, Ta, Ti, Mo, and W, an alloy containing the above element as its component, or the like can be used. Any of Mn, Mg, Zr, Be, Nd, and Sc, or a material including any of these in combination may be used. The details are similar to those of the source or drain electrode layer 142a, the source or drain electrode layer 142b, and the like.

Through the above steps, the transistor 162 and the capacitor 164 are completed. The transistor 162 includes the highly purified oxide semiconductor layer 403 sandwiched between films containing excess oxygen. Therefore, fluctuation in the electric characteristics of the transistor 162 is suppressed, and the transistor 162 is electrically stable. The capacitor 164 includes the source or drain electrode layer 142a, the silicon oxide film 407a, and the electrode layer 148b.

FIG. 7C is an example of a diagram of a circuit using the semiconductor device as a memory element. In FIG. 7C, one of a source electrode layer and a drain electrode layer of the transistor 162, one electrode layer of the capacitor 164, and a gate electrode layer of the transistor 140 are electrically connected to one another. A first wiring (1st Line, also referred to as source line) is electrically connected to a source electrode layer of the transistor 140. A second wiring (2nd Line, also referred to as bit line) is electrically connected to a drain electrode layer of the transistor 140. A third wiring (3rd Line, also referred to as first signal line) is electrically connected to the other of the source electrode layer and the drain electrode layer of the transistor 162. A fourth wiring (4th Line, also referred to as second signal line) is electrically connected to a gate electrode layer of the transistor 162. A fifth wiring (5th Line, also referred to as word line) is electrically connected to the other electrode layer of the capacitor 164.

The transistor 162 formed using an oxide semiconductor has extremely small off-state current; therefore, when the transistor 162 is in an off state, a potential of a node (hereinafter node FG) where the one of the source electrode layer and the drain electrode layer of the transistor 162, the one electrode layer of the capacitor 164, and the gate electrode layer of the transistor 140 are electrically connected to one another can be held for an extremely long time. The capacitor 164 facilitates holding of charge applied to the node FG and reading of stored data.

When data is stored in the semiconductor device (writing), the potential of the fourth wiring is set to a potential at which the transistor 162 is turned on, whereby the transistor 162 is turned on. Thus, the potential of the third wiring is supplied to the node FG and a predetermined amount of charge is accumulated in the node FG. Here, charge for applying either of two different potential levels (hereinafter referred to as low-level charge and high-level charge) is applied. After that, the potential of the fourth wiring is set to a potential at which the transistor 162 is turned off, whereby the transistor 162 is turned off. This makes the node FG floating and the predetermined amount of charge is held in the node FG. The predetermined amount of charge is thus accumulated and held in the node FG, whereby the memory cell can store data.

Since the off-state current of the transistor 162 is extremely small, the charge applied to the node FG is held for a long time. This can remove the need of refresh operation or drastically reduce the frequency of the refresh operation, which leads to a sufficient reduction in power consumption. Moreover, stored data can be held for a long time even when power is not supplied.

When stored data is read out (reading), while a predetermined potential (fixed potential) is supplied to the first wiring, an appropriate potential (reading potential) is supplied to the fifth wiring, whereby the transistor 140 changes its state depending on the amount of charge held in the node FG. This is because in general, when the transistor 140 is an n-channel transistor, an apparent threshold value $V_{th\_H}$ of the transistor 140 in the case where the high-level charge is held in the node FG is lower than an apparent threshold value $V_{th\_L}$ of the transistor 140 in the case where the low-level charge is held in the node FG Here, an apparent threshold value refers to a potential of the fifth wiring, which is needed to turn on the transistor 140. Thus, by setting the potential of the fifth wiring to a potential $V_0$ which is between $V_{th\_H}$ and $V_{th\_L}$, charge held in the node FG can be determined. For example, in the case where the high-level charge is applied in writing, when the potential of the fifth wiring is set to $V_0$ ($>V_{th\_H}$), the transistor 140 is turned on. In the case where the low level charge is applied in writing, even when the potential of the fifth wiring is set to $V_0$ ($<V_{th\_L}$), the transistor 140 remains in an off state. In such a manner, by controlling the potential of the fifth wiring and determining whether the transistor 140 is in an on state or off state (reading out the potential of the second wiring), stored data can be read out.

Further, in order to rewrite stored data, a new potential is supplied to the node FG that is holding the predetermined amount of charge applied in the above writing, so that the charge of new data is held in the node FG Specifically, the potential of the fourth wiring is set to a potential at which the transistor 162 is turned on, whereby the transistor 162 is turned on. Thus, the potential of the third wiring (potential of new data) is supplied to the node FG, and the predetermined amount of charge is accumulated in the node FG. After that, the potential of the fourth wiring is set to a potential at which the transistor 162 is turned off, whereby the transistor 162 is turned off. Thus, charge of the new data is held in the node FG. In other words, while the predetermined amount of charge applied in the first writing is held in the node FG, the same operation (second writing) as in the first writing is performed, whereby the stored data can be overwritten.

The off-state current of the transistor 162 described in this embodiment can be sufficiently reduced by using an oxide semiconductor layer 403 which is highly purified and sandwiched between films containing excess oxygen. Further, by using such a transistor, a semiconductor device in which stored data can be held for an extremely long time can be obtained.

As described above, fluctuation in the electric characteristics of a transistor including a highly purified oxide semiconductor film in which formation of an oxygen vacancy is suppressed, and the transistor is electrically stable. Thus, by using the transistor, a highly reliable semiconductor device can be provided.

The methods, structures, and the like described in this embodiment can be combined as appropriate with any of the methods, structures, and the like described in the other embodiments.

(Embodiment 6)

A semiconductor device disclosed in this specification can be applied to a variety of electronic appliances (including game machines). Examples of electronic appliances are a television set (also referred to as television or television receiver), a monitor of a computer or the like, a camera such as a digital camera or a digital video camera, a digital photo frame, a mobile phone (also referred to as cellular phone or cellular phone device), a portable game machine, a personal digital assistant, an audio reproducing device, and a large-sized game machine such as a pachinko machine. Examples of electronic appliances each including the semiconductor device described in any of the above embodiments will be described.

Figure 13A:
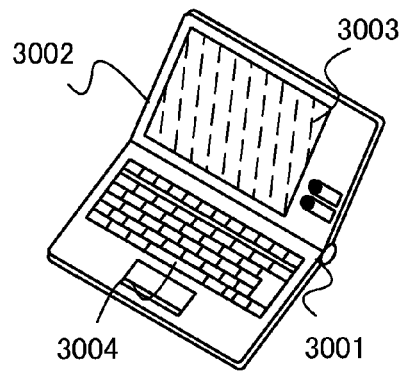
FIGS. 13A to 13F illustrate electronic appliances.

FIG. 13A illustrates a laptop personal computer including a main body 3001, a housing 3002, a display portion 3003, a keyboard 3004, and the like. The semiconductor device described in any of the above embodiments is applied to the display portion 3003, whereby a highly reliable laptop personal computer can be provided.

Figure 13B:
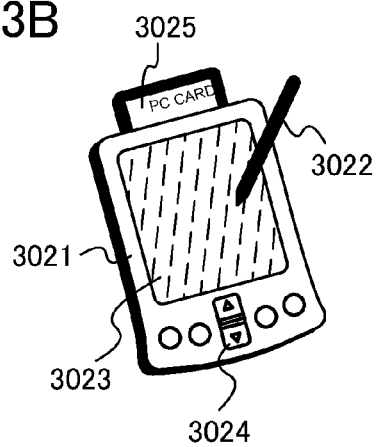

FIG. 13B is a personal digital assistant (PDA) including a display portion 3023, an external interface 3025, an operation button 3024, and the like in a main body 3021. A stylus 3022 is provided as an accessory for operation. The semiconductor device described in any of the above embodiments is applied to the display portion 3023, whereby a highly reliable personal digital assistant (PDA) can be provided.

Figure 13C:
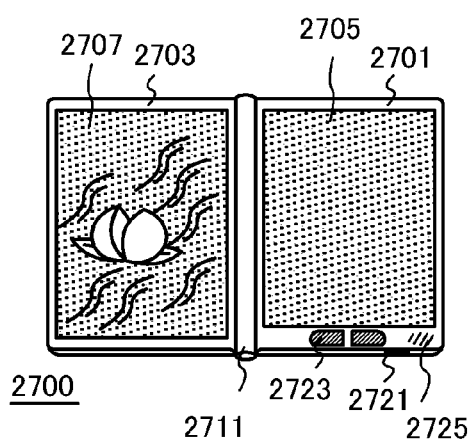

FIG. 13C illustrates an example of an e-book reader. For example, an e-book reader 2700 includes two housings, a housing 2701 and a housing 2703. The housing 2701 and the housing 2703 are combined with a hinge 2711 so that the e-book reader can be opened and closed with the hinge 2711 as an axis. With such a structure, the e-book reader can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 13C) can display text and a display portion on the left side (the display portion 2707 in FIG. 13C) can display graphics. The semiconductor device described in any of the above embodiments is applied to the display portion 2705 and the display portion 2707, whereby the highly reliable e-book reader 2700 can be provided. In the case of using a transflective or reflective liquid crystal display device as the display portion 2705, the e-book reader may be used in a comparatively bright environment; therefore, a solar cell may be provided so that power generation by the solar cell and charge by a battery can be performed. When a lithium ion battery is used as the battery, there are advantages of downsizing and the like.

FIG. 13C illustrates an example in which the housing 2701 includes an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (such as an earphone terminal or a USB terminal), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an e-book server.

Figure 13D:
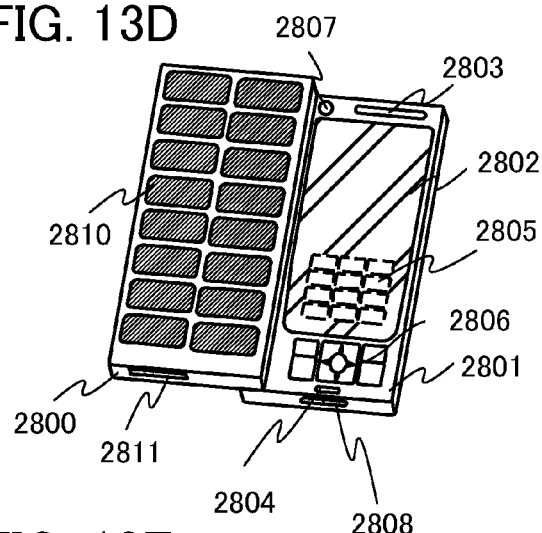

FIG. 13D illustrates a mobile phone including two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. An antenna is incorporated in the housing 2801. The semiconductor device described in any of the above embodiments is applied to the display panel 2802, whereby a highly reliable mobile phone can be provided.

Further, the display panel 2802 includes a touch panel. A plurality of operation keys 2805 displayed as images is illustrated by dashed lines in FIG. 13D. Note that a boosting circuit by which voltage output from the solar cell 2810 is increased to be sufficiently high for each circuit is also included.

In the display panel 2802, the display direction can be appropriately changed depending on a usage pattern. Further, the mobile phone is provided with the camera lens 2807 on the same surface as the display panel 2802; thus, it can be used as a video phone. The speaker 2803 and the microphone 2804 can be used for videophone calls, recording and playing sound, and the like as well as voice calls. Furthermore, the housings 2800 and 2801 which are developed as illustrated in FIG. 13D can overlap with each other by sliding; thus, the size of the mobile phone can be reduced, which makes the mobile phone suitable for being carried.

The external connection terminal 2808 can be connected to an AC adapter and various types of cables such as a USB cable, and charge and data communication with a personal computer or the like are possible. Moreover, a large amount of data can be stored by inserting a memory medium into the external memory slot 2811 and can be moved.

Further, in addition to the above functions, an infrared communication function, a television reception function, or the like may be provided.

Figure 13E:
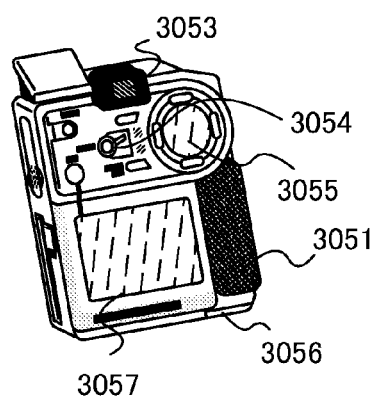

FIG. 13E illustrates a digital video camera including a main body 3051, a display portion A 3057, an eyepiece 3053, an operation switch 3054, a display portion B 3055, a battery 3056, and the like. The semiconductor device described in any of the above embodiments is applied to the display portion A 3057 and the display portion B 3055, whereby a highly reliable digital video camera can be provided.

Figure 13F:
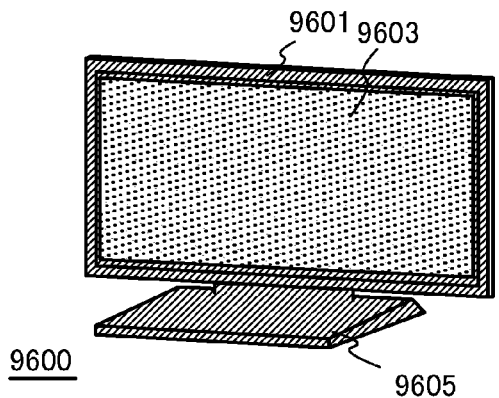

FIG. 13F illustrates an example of a television set. In a television set 9600, a display portion 9603 is incorporated in a housing 9601. The display portion 9603 can display images. Here, the housing 9601 is supported by a stand 9605. The semiconductor device described in any of the above embodiments is applied to the display portion 9603, whereby the highly reliable television set 9600 can be provided.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) data communication can be performed.

This embodiment can be implemented in appropriate combination with any of the structures described in the other embodiments.

EXAMPLE

In this example, properties of an aluminum oxide film used as a barrier film in a semiconductor device according to one embodiment of the invention disclosed herein were evaluated. The results are shown in FIGS. 14A1, 14A2, 14B1, and 14B2, FIGS. 15A1, 15A2, 15B1, and 15B2, FIGS. 16A to 16D, and FIGS. 17A to 17D. As evaluation methods, secondary ion mass spectrometry (SIMS) and thermal desorption spectrometry (TDS) were used.

First, evaluation by SIMS analysis is described. As a comparative example, a comparative sample A was fabricated in such a manner that a silicon oxide film was formed to a thickness of 100 nm over a glass substrate by a sputtering method. Further, as an example, an example sample A was fabricated in such a manner that a silicon oxide film was formed to a thickness of 100 nm over a glass substrate by a sputtering method, and an aluminum oxide film was formed to a thickness of 100 nm over the silicon oxide film by a sputtering method.

For each of the comparative sample A and the example sample A, the silicon oxide film was formed under the following conditions: a silicon oxide ($SiO_2$) target was used as a target, the distance between the glass substrate and the target was 60 mm, the pressure was 0.4 Pa, the power of the power source was 1.5 kW, the atmosphere was an oxygen atmosphere (the oxygen flow rate was 50 sccm), and the substrate temperature was 100° C.

For the example sample A, the aluminum oxide film was formed under the following conditions: an aluminum oxide ($Al_2O_3$) target was used as a target, the distance between the glass substrate and the target was 60 mm, the pressure was 0.4 Pa, the power of the power source was 1.5 kW, the atmosphere was a mixed atmosphere containing argon and oxygen (the argon flow rate was 25 sccm and the oxygen flow rate was 25 sccm), and the substrate temperature was 250° C.

The comparative sample A and the example sample A were each subjected to a pressure cooker test (PCT). In the PCT in this example, the comparative sample A and the example sample A were held for 100 hours under the following conditions: the temperature was 130° C., the humidity was 85% (the volume ratio of water to deuterated water of water vapor contained in a gas is $H_2O$ (water):$D_2O$ (deuterium oxide)=3:1), and the atmospheric pressure was 2.3 atm (0.23 MPa).

In this example, a "D-atom", which is expressed by deuterium oxide or the like, expresses a hydrogen atom with a mass number of 2 ($^2H$).

As SIMS analysis, substrate side depth profile (SSDP) SIMS was used to measure concentrations of an H atom and a D atom in the comparative sample A and the example sample A before and after the PCT.

FIG. 14A1 shows H-atom and D-atom concentration profiles of the comparative sample A before the PCT, and FIG. 14A2 shows H-atom and D-atom concentration profiles of the comparative sample A after the PCT, which were obtained using SIMS. In FIGS. 14A1 and 14A2, a D-atom expected concentration profile is a calculated concentration profile of the D atom existing in nature, which was obtained using the H-atom concentration profile on the assumption that the abundance ratio of the D atom thereto is 0.015%. Therefore, the amount of the D atom mixed into the sample by the PCT equals the difference between the measured D-atom concentration after the PCT and the D-atom expected concentration after the PCT. FIG. 14B1 shows a D-atom concentration profile before the PCT, which was obtained by subtracting the D-atom expected concentration from the measured D-atom concentration, and FIG. 14B2 shows a D-atom concentration profile after the PCT, which was obtained by subtracting the D-atom expected concentration from the measured D-atom concentration.

In a similar manner, FIG. 15A1 shows H-atom and D-atom concentration profiles of the example sample A before the PCT, and FIG. 15A2 shows H-atom and D-atom concentration profiles of the example sample A after the PCT, which were obtained using SIMS. Further, FIG. 15B1 shows a D-atom concentration profile before the PCT, which was obtained by subtracting the D-atom expected concentration from the measured D-atom concentration, and FIG. 15B2 shows a D-atom concentration profile after the PCT, which was obtained by subtracting the D-atom expected concentration from the measured D-atom concentration.

Note that all the results of SIMS analysis in this example were quantified using a standard sample of a silicon oxide film.

As shown in FIGS. 14A1, 14A2, 14B1, and 14B2, while the measured D-atom concentration profile overlaps with the D-atom expected concentration profile before the PCT, the measured D-atom concentration greatly increases after the PCT; accordingly, it is found that the D atom was mixed into the silicon oxide film. Therefore, it is confirmed that the silicon oxide film of the comparative sample has a low bather property with respect to moisture ($H_2O$ and $D_2O$) from the outside.

In contrast, as shown in FIGS. 15A1, 15A2, 15B1, and 15B2, as for the example sample A in which the aluminum oxide film was stacked over the silicon oxide film, it is found that only a slight amount of D atom entered a region close to a surface of the aluminum oxide film by the PCT and that the D atom entered neither the aluminum oxide film at a depth around 30 nm or greater nor the silicon oxide film. Therefore, it is confirmed that the aluminum oxide film has a high bather property with respect to moisture ($H_2O$ and $D_2O$) from the outside.

The following shows evaluation by TDS analysis. As an example sample, an example sample B was fabricated in such a manner that a silicon oxide film was formed to a thickness of 100 nm over a glass substrate by a sputtering method, and an aluminum oxide film was formed to a thickness of 20 nm over the silicon oxide film by a sputtering method. Further, as a comparative example, a comparative sample B was fabricated in such a manner that after the example sample B was measured by TDS analysis, the aluminum oxide film thereof was removed, and only the silicon oxide film was left over the glass substrate.

For each of the comparative sample B and the example sample B, the silicon oxide film was formed under the following conditions: a silicon oxide ($SiO_2$) target was used as a target, the distance between the glass substrate and the target was 60 mm, the pressure was 0.4 Pa, the power of the power source was 1.5 kW, the atmosphere was an oxygen atmosphere (the oxygen flow rate was 50 sccm), and the substrate temperature was 100° C.

For the example sample B, the aluminum oxide film was formed under the following conditions: an aluminum oxide ($Al_2O_3$) target was used as a target, the distance between the glass substrate and the target was 60 mm, the pressure was 0.4 Pa, the power of the power source was 1.5 kW, the atmosphere was a mixed atmosphere containing argon and oxygen (the argon flow rate was 25 sccm and the oxygen flow rate was 25 sccm), and the substrate temperature was 250° C.

Other three types of the comparative sample B and the example sample B were fabricated by further performing heat treatment at 300° C., 450° C., and 600° C., respectively. The heat treatment was performed for 1 hour in a nitrogen atmosphere for each sample.

Figure 16A:
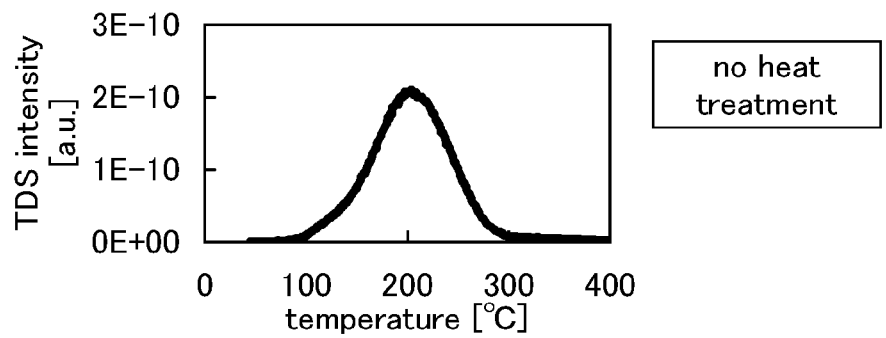
FIGS. 16A to 16D show results of TDS measurement.
Figure 16B:
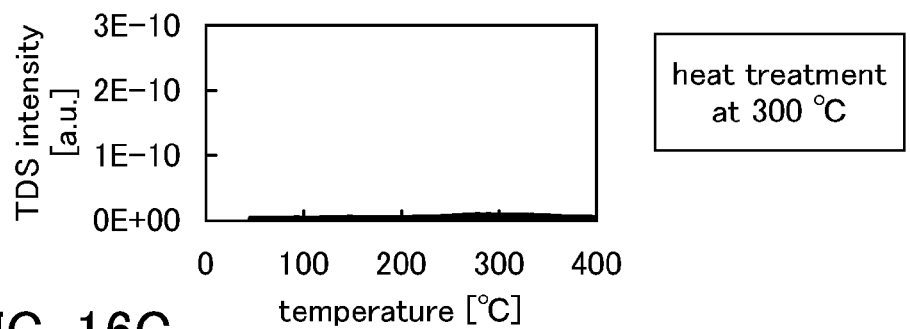
Figure 16C:
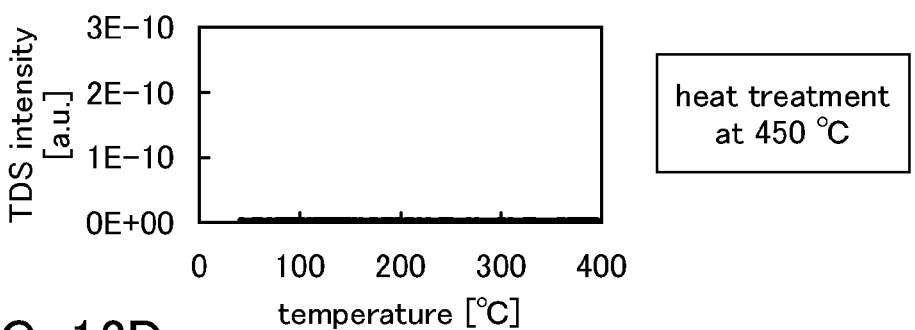
Figure 16D:
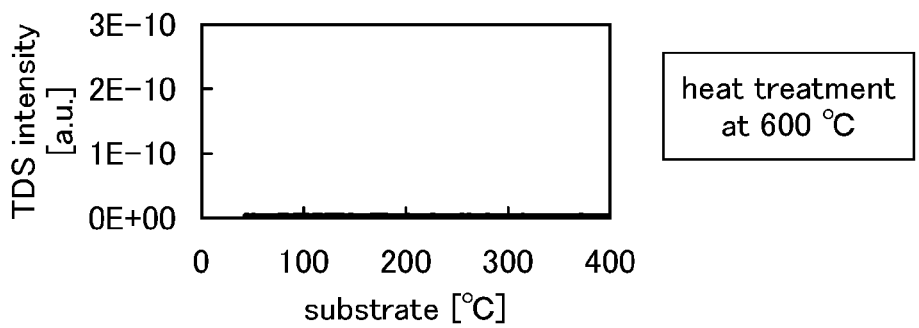
Figure 17A:
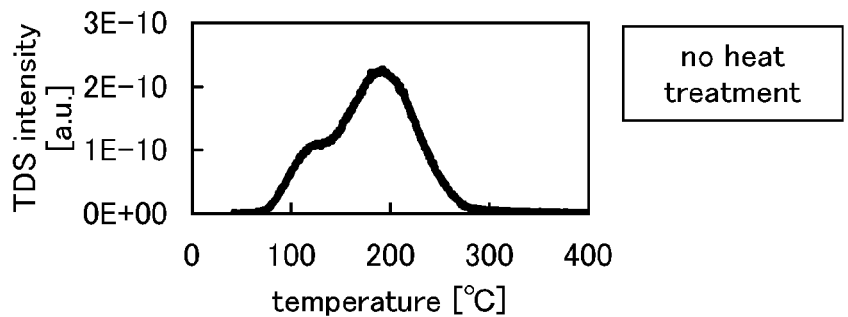
FIGS. 17A to 17D show results of TDS measurement.
Figure 17B:
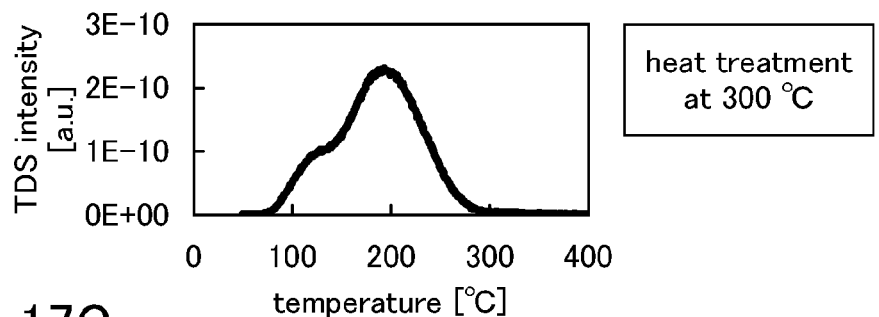
Figure 17C:
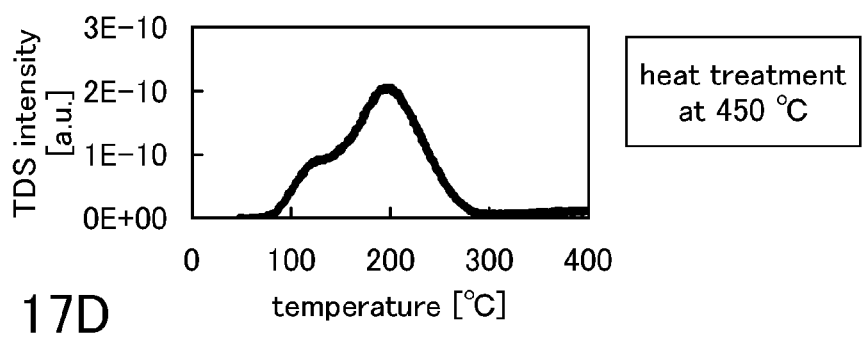
Figure 17D:
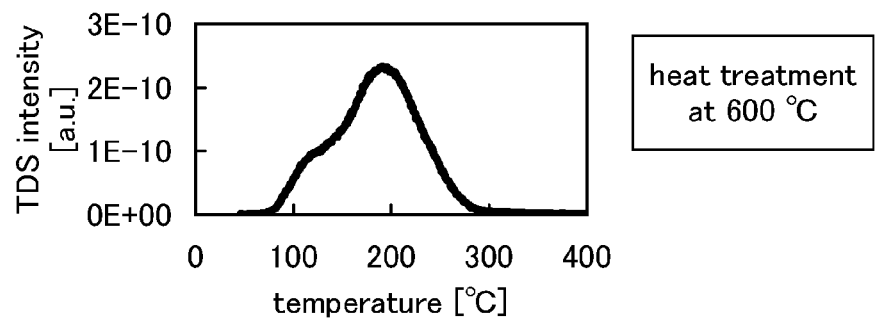

TDS analysis was performed on the four types of the comparative sample B and the four types of the example sample B fabricated under the respective four conditions (without heat treatment, with 300° C. heat treatment, with 450° C. heat treatment, and with 600° C. heat treatment). FIG. 16A shows a TDS spectrum of the comparative sample B subjected to no heat treatment, FIG. 16B shows that of the comparative sample B subjected to heat treatment at 300° C., FIG. 16C shows that of the comparative sample B subjected to heat treatment at 450° C., and FIG. 16D shows that of the comparative sample B subjected to heat treatment at 600° C., each at M/z=32 ($O_2$). Further, FIG. 17A shows a TDS result of the example sample B subjected to no heat treatment, FIG. 17B shows that of the example sample B subjected to heat treatment at 300° C., FIG. 17C shows that of the example sample B subjected to heat treatment at 450° C., and FIG. 17D shows that of the example sample B subjected to heat treatment at 600° C., each at M/z=32 ($O_2$).

As shown in FIGS. 16A to 16D, it can be seen in FIG. 16A that oxygen was released from the silicon oxide film of the comparative sample B which was not subjected to heat treatment, but the amount of oxygen released was greatly decreased in the comparative sample B subjected to the heat treatment at 300° C. in FIG. 16B, and became smaller than or equal to a background level of TDS measurement in the comparative sample B subjected to the heat treatment at 450° C. in FIG. 16C and the comparative sample B subjected to the heat treatment at 600° C. in FIG. 16D.

The results in FIGS. 16A to 16D indicate that 90% or more of excess oxygen contained in the silicon oxide film was released outside the silicon oxide film by the heat treatment at 300° C. and that substantially all of the excess oxygen contained in the silicon oxide film was released outside the silicon oxide film by the heat treatment at 450° C. and 600° C. Therefore, it is confirmed that the silicon oxide film has a low barrier property with respect to oxygen.

In contrast, as shown in FIGS. 17A to 17D, substantially the same amount of oxygen was released from every type of the example sample B, in which the aluminum oxide film was formed over the silicon oxide film, regardless of whether the heat treatment was not performed or was performed at 300° C., 450° C., and 600° C.

The results in FIGS. 17A to 17D indicate that when the aluminum oxide film was formed over the silicon oxide film, the excess oxygen contained in the silicon oxide film was not easily released to the outside by heat treatment and the state where the excess oxygen was contained in the silicon oxide film was held to a considerable extent. Therefore, it is confirmed that the aluminum oxide film has a high barrier property with respect to oxygen.

The above results confirm that the aluminum oxide film has both a high barrier property with respect to hydrogen and moisture and a high barrier property with respect to oxygen, and functions suitably as a barrier film with respect to hydrogen, moisture, and oxygen.

Therefore, during a manufacturing process of a transistor including an oxide semiconductor film and after the manufacture thereof, the aluminum oxide film can function as a protective film for preventing entry of an impurity such as hydrogen or moisture, which can cause a change, into the oxide semiconductor film and release of oxygen, which is a main component material of the oxide semiconductor, from the oxide semiconductor film.

Further, the oxide semiconductor film formed has high purity because an impurity such as hydrogen or moisture is not mixed therein, and includes a region where the oxygen content is greater than that in a stoichiometric composition of the oxide semiconductor because oxygen is prevented from being released. Accordingly, by using the oxide semiconductor film for a transistor, fluctuation in the threshold voltage Vth of the transistor due to an oxygen vacancy and a shift of the threshold voltage ΔVth can be reduced.

This application is based on Japanese Patent Application serial no. 2011-081859 filed with Japan Patent Office on Apr. 1, 2011, the entire contents of which are hereby incorporated by reference.

What is claimed is:

1. A method for manufacturing a semiconductor device, comprising the steps of:
   forming a gate electrode layer over a substrate;
   forming a first aluminum oxide layer over the gate electrode layer in a first chamber of an apparatus;
   forming a first silicon oxide layer over the first aluminum oxide layer in a second chamber of the apparatus;
   forming an oxide semiconductor layer over the first silicon oxide layer in a third chamber of the apparatus;
   performing a heat treatment on the oxide semiconductor layer in a fourth chamber of the apparatus; and performing an oxygen supplying treatment on the oxide semiconductor layer in a fifth chamber of the apparatus;

wherein the steps of forming the first aluminum oxide layer, forming the first silicon oxide layer, forming the oxide semiconductor layer, performing the heat treatment, and performing the oxygen supplying treatment are successively performed without exposing the substrate to air, and wherein the first chamber, the second chamber, the third chamber, the fourth chamber, and the fifth chamber are connected in series.

2. The method for manufacturing a semiconductor device according to claim 1, wherein the oxide semiconductor layer comprises indium, gallium, and zinc.

3. The method for manufacturing a semiconductor device according to claim 1, wherein the first aluminum oxide layer comprises oxygen at an amount exceeding that in an stoichiometric composition ratio of aluminum oxide.

4. The method for manufacturing a semiconductor device according to claim 1, wherein the first silicon oxide layer comprises oxygen at an amount exceeding that in an stoichiometric composition ratio of silicon oxide.

5. The method for manufacturing a semiconductor device according to claim 1, wherein the oxygen supplying treatment is performed to form an oxygen-excess region in the oxide semiconductor layer.

6. A method for manufacturing a semiconductor device, comprising the steps of:
    forming a gate electrode layer over a substrate;
    forming a first aluminum oxide layer over the gate electrode layer in a first chamber of a first apparatus;
    forming a first silicon oxide layer over the first aluminum oxide layer in a second chamber of the first apparatus;
    forming an oxide semiconductor layer over the first silicon oxide layer in a third chamber of the first apparatus;
    performing a first heat treatment on the oxide semiconductor layer in a fourth chamber of the first apparatus;
    performing an oxygen supplying treatment on the oxide semiconductor layer in a fifth chamber of the first apparatus;
    forming a source electrode layer and a drain electrode layer over the oxide semiconductor layer;
    forming a second silicon oxide layer over the source electrode layer and the drain electrode layer in a sixth chamber of a second apparatus;
    forming a second aluminum oxide layer over the second silicon oxide layer in a seventh chamber of the second apparatus; and
    performing a second heat treatment on the oxide semiconductor layer in a eighth chamber of the second apparatus,
    wherein the steps of forming the first aluminum oxide layer, forming the first silicon oxide layer, forming the oxide semiconductor layer, performing the first heat treatment, and performing the oxygen supplying treatment are successively performed without exposing the substrate to air,
    wherein the first chamber, the second chamber, the third chamber, the fourth chamber, and the fifth chamber are connected in series,
    wherein the steps of forming the second silicon oxide layer, forming the second aluminum oxide layer, and performing the second heat treatment are successively performed without exposing the substrate to air, and
    wherein the sixth chamber, the seventh chamber, and the eighth chamber are connected in series.

7. The method for manufacturing a semiconductor device according to claim 6, wherein the oxide semiconductor layer comprises indium, gallium, and zinc.

8. The method for manufacturing a semiconductor device according to claim 6, wherein the first aluminum oxide layer comprises oxygen at an amount exceeding that in an stoichiometric composition ratio of aluminum oxide.

9. The method for manufacturing a semiconductor device according to claim 6, wherein the first silicon oxide layer comprises oxygen at an amount exceeding that in an stoichiometric composition ratio of silicon oxide.

10. The method for manufacturing a semiconductor device according to claim 6, wherein the oxygen supplying treatment is performed to form an oxygen-excess region in the oxide semiconductor layer.

11. The method for manufacturing a semiconductor device according to claim 6, wherein the second silicon oxide layer comprises oxygen at an amount exceeding that in an stoichiometric composition ratio of silicon oxide.

12. The method for manufacturing a semiconductor device according to claim 6, wherein the second aluminum oxide layer comprises oxygen at an amount exceeding that in an stoichiometric composition ratio of aluminum oxide.

13. A method for manufacturing a semiconductor device, comprising the steps of:
    forming a gate electrode layer over a substrate;
    forming a first aluminum oxide layer over the gate electrode layer in a first chamber of a first apparatus;
    forming a first silicon oxide layer over the first aluminum oxide layer in a second chamber of the first apparatus;
    forming an oxide semiconductor layer over the first silicon oxide layer in a third chamber of the first apparatus;
    performing a first heat treatment on the oxide semiconductor layer in a fourth chamber of the first apparatus;
    performing an oxygen supplying treatment on the oxide semiconductor layer in a fifth chamber of the first apparatus;
    forming a source electrode layer and a drain electrode layer over the oxide semiconductor layer;
    forming a second silicon oxide layer over the source electrode layer and the drain electrode layer in a sixth chamber of a second apparatus;
    forming a layer over the second silicon oxide layer in a seventh chamber of the second apparatus;
    forming a second aluminum oxide layer over the layer in a eighth chamber of the second apparatus; and
    performing a second heat treatment on the oxide semiconductor layer in a ninth chamber of the second apparatus,
    wherein the layer formed in the seventh chamber comprises one selected from the group consisting of a combination of an organic compound and a metal oxide, a transparent conductive oxide, and an oxide semiconductor comprising nitrogen,
    wherein the steps of forming the first aluminum oxide layer, forming the first silicon oxide layer, forming the oxide semiconductor layer, performing the first heat treatment, and performing the oxygen supplying treatment are successively performed without exposing the substrate to air,
    wherein the first chamber, the second chamber, the third chamber, the fourth chamber, and the fifth chamber are connected in series,
    wherein the steps of forming the second silicon oxide layer, forming the layer, forming the second aluminum oxide layer, and performing the second heat treatment are successively performed without exposing the substrate to air, and wherein the sixth chamber, the seventh chamber, the eighth chamber, and the ninth chamber are connected in series.

14. The method for manufacturing a semiconductor device according to claim 13, wherein the oxide semiconductor layer comprises indium, gallium, and zinc.

15. The method for manufacturing a semiconductor device according to claim 13, wherein the first aluminum oxide layer comprises oxygen at an amount exceeding that in an stoichiometric composition ratio of aluminum oxide.

16. The method for manufacturing a semiconductor device according to claim 13, wherein the first silicon oxide layer comprises oxygen at an amount exceeding that in an stoichiometric composition ratio of silicon oxide.

17. The method for manufacturing a semiconductor device according to claim 13, wherein the oxygen supplying treatment is performed to form an oxygen-excess region in the oxide semiconductor layer.

18. The method for manufacturing a semiconductor device according to claim 13, wherein the second silicon oxide layer comprises oxygen at an amount exceeding that in an stoichiometric composition ratio of silicon oxide.

19. The method for manufacturing a semiconductor device according to claim 13, wherein the second aluminum oxide layer comprises oxygen at an amount exceeding that in an stoichiometric composition ratio of aluminum oxide.

20. The method for manufacturing a semiconductor device according to claim 13,
wherein the metal oxide is a transition metal oxide, and
wherein the organic compound has a hole-transport property.

* * * * *

UNITED STATES PATENT AND TRADEMARK OFFICE
CERTIFICATE OF CORRECTION

PATENT NO. : 8,541,266 B2  
APPLICATION NO. : 13/429977  
DATED : September 24, 2013  
INVENTOR(S) : Shunpei Yamazaki Page 1 of 1

It is certified that error appears in the above-identified patent and that said Letters Patent is hereby corrected as shown below:

In the Specification

At column 4, line 15, "bather" should be --barrier--;

At column 12, line 9, "bather" should be --barrier--;

At column 20, line 30, "(9-phenylcarbazol-3-yl-amino]" should be --(9-phenylcarbazol-3-yl)amino]--;

At column 34, line 60, "minor-polished" should be --mirror-polished--;

At column 38, line 59, "FG Here," should be --FG. Here,--;

At column 43, line 1, "bather" should be --barrier--;

At column 43, line 11, "bather" should be --barrier--.

Signed and Sealed this  
Eighteenth Day of February, 2014

Michelle K. Lee  
*Deputy Director of the United States Patent and Trademark Office*